United States Patent [19]
Shichijyo et al.

[11] Patent Number: 5,809,048
[45] Date of Patent: Sep. 15, 1998

[54] WAVELENGTH STABILIZED LIGHT SOURCE

[75] Inventors: Shiro Shichijyo; Kiyofumi Muro, both of Sodegaura, Japan

[73] Assignee: Mitsui Petrochemical Industries, Ltd., Toyko, Japan

[21] Appl. No.: 871,065

[22] Filed: Jul. 9, 1997

Related U.S. Application Data

[63] Continuation of Ser. No. 557,948, Nov. 14, 1995, abandoned.

[30] Foreign Application Priority Data

Nov. 14, 1994 [JP] Japan ................................. 6-279495

[51] Int. Cl.⁶ ........................................................ H01S 3/13
[52] U.S. Cl. ............................ 372/32; 372/106; 372/105; 372/99; 372/98; 372/45; 372/22; 372/5
[58] Field of Search .................................. 372/32, 22, 5, 372/98, 99, 45, 105, 106, 23, 92

[56] References Cited

U.S. PATENT DOCUMENTS

| | | | |
|---|---|---|---|
| 5,341,393 | 8/1994 | Okazaki et al. | 372/69 |
| 5,381,427 | 1/1995 | Wedekind et al. | 372/27 |
| 5,452,312 | 9/1995 | Yamamoto et al. | 372/5 |

FOREIGN PATENT DOCUMENTS

| | | |
|---|---|---|
| 20331303 | 2/1989 | European Pat. Off. |
| 0596714 | 5/1994 | European Pat. Off. |
| 6075261 | 9/1992 | Japan . |
| 6-75261 | 3/1994 | Japan . |
| 7-152055 | 6/1995 | Japan . |
| WO9004867 | 5/1990 | WIPO . |

OTHER PUBLICATIONS

Optics Letters, vol. 16, No. 10, May 15, 1991, pp. 732–734, "Electronically tunable single–mode ... laser" by J.R. Andrews.

"Stable and Efficient Green Light Generation by Intracavity Frequency Doubling of ND:YV04 Lasers" Applied Physics Letters, vol. 63, No. 3, Jul. 19, 1993, pp. 299–301, XP000382577.

"Electronically Tunable Single–Mode External–Cavity Diode Laser" Optics Letters, vol. 16, No. 10, May 15, 1991, pp. 732–734, XPOOO202054, J.R. Andrews.

"Efficient Intracavity Sum–Frequency Generation of 490–nm Radiation by Use of Potassium Niobate", Optics Letters, vol. 19, No. 14, Jul. 15, 1994, pp. 1022–1024, XOOOO455024.

*Primary Examiner*—Leon Scott, Jr.

[57] ABSTRACT

A short wavelength light source mainly comprises a semiconductor laser for pumping a laser medium, a birefringence filter for controlling or stabilizing the waveform by applying an optical feedback to the semiconductor laser to feed back only light of specific wavelength, lens systems for focusing the pumping light, and an optical resonator composed of a laser medium formed of Nd:YAG doped with 1% of Nd and a nonlinear optical element formed of $KNbO_3$. The birefringence filter is structured as a Lyot filter, and is composed of a birefringence element made of 2 mm thick non-doped $YVO_4$, a polarizer, and a birefringence element made of 4 mm thick non-doped $YVO_4$.

This constitution realizes a short wavelength light source achieving a single longitudinal mode oscillation while maintaining a high output, small in size, superior in efficiency, and excellent in wavelength stability.

19 Claims, 19 Drawing Sheets

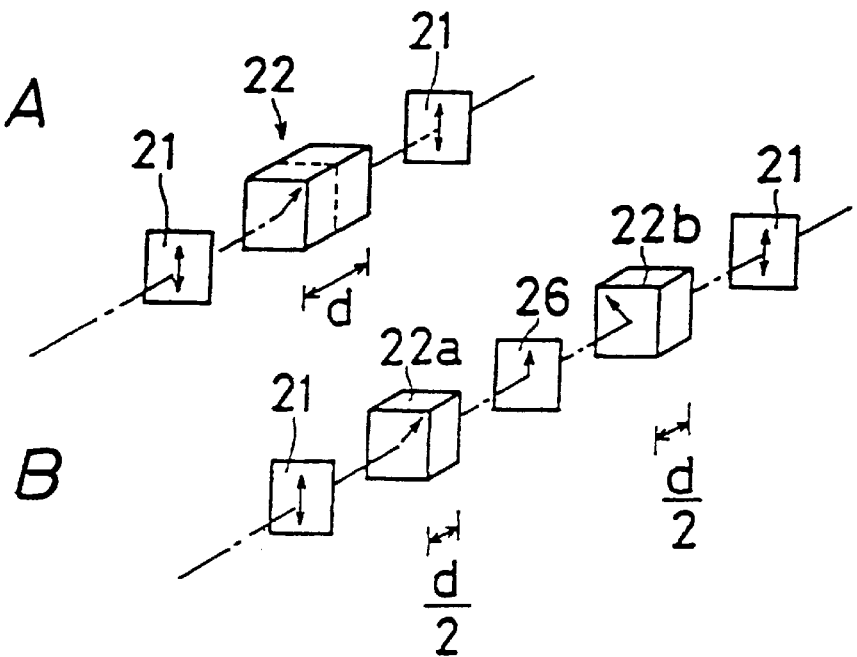
FIG.10A
FIG.10B
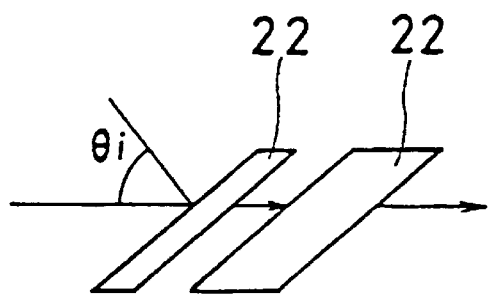
FIG.11

WAVELENGTH STABILIZED LIGHT SOURCE

This application is a continuation of application Ser. No. 08/557,948 filed on Nov. 14, 1995, now abandoned.

BACKGROUND OF THE INVENTION

1. Field of the Invention

The present invention relates to a wavelength stabilized light source comprising a semiconductor laser for excitation and an optical resonator including a solid state laser and a nonlinear optical element, preferably used in optical disk appliances, optical communications, and various measurements.

2. Description of the Related Art

Hitherto, a light source of short wavelength has been demanded for enhancement of density of recording and reproduction in the fields of optical disk, image processing and the like, and, for example, by using a semiconductor laser as an excitation light source, short wavelength light such as green light and blue light is obtained by highly efficient wavelength conversion. For stable information recording and reproducing, it is demanded that the output light intensity distribution has a Gaussian profile, output light can be condensed nearly up to the diffraction limit, and stable outputs are obtained.

For example, in order to obtain a short wavelength light source for generating output light, for example, of several mW or more, a method of generating second harmonics or sum frequency waves by inputting the laser light from the semiconductor laser into a wavelength converting element, or an internal resonator type comprising a semiconductor laser for excitation and optical resonator internally containing a laser active medium and a nonlinear optical element may be considered useful. In particular, when the semiconductor laser is used as a light source for exciting for a second harmonic generator (SHG) laser of the internal resonator type, the stabilization of wavelength and output and the enhancement of efficiency of wavelength conversion are important.

FIG. 25 is a schematic structural diagram showing a short wavelength light source of a conventional internal resonator type. The light radiated from a semiconductor laser 1 is transformed into a parallel beam by a collimating lens 2, and is condensed on a laser medium 4 composed of Nd:YVO$_4$ and others by a condenser lens 3. On the incident side end face 4a of the laser medium 4, a coating is applied so as to be antireflective (AR) to output a wavelength of 809 nm of the semiconductor laser 1, and to have a high reflectivity (HR) to 1064 nm oscillation wavelength of the laser medium 4. An output mirror 6 has an HR coating for 1064 nm oscillation wavelength, and an optical resonator 7 to a fundamental wave of 1064 nm wavelength is composed of the output mirror 6 and the end face 4a of the laser medium 4. Inside the optical resonator 7, a nonlinear optical crystal 5 such as KTP is disposed, and the second harmonic wave whose wavelength has been converted herein is radiated from the output mirror 6.

Hitherto, as an excitation light source of such a SHG solid state laser, a semiconductor laser of multiple longitudinal mode has been used. The semiconductor laser of multiple longitudinal mode is not only high in output, but also has a wide oscillation wavelength range for the width of absorption spectrum of a laser medium. Additionally, by temperature changes of the semiconductor laser itself or phase changes of the return light, the peak position of the longitudinal mode changes in the course of time, and hence the light absorption quantity in the laser medium varies, which may be a cause to induce instability of oscillation wavelength or output of the laser medium.

FIG. 26 is a graph showing the spectrum changes in the case of changing slightly the distance from the semiconductor laser to the return light generation position. The upper graph relates to before dislocation and the lower graph to after dislocation. As seen from the two graphs, many oscillation spectra are observed because of oscillation in multiple mode, and the oscillation spectrum changes significantly when the return light generation position is slightly dislocated. Besides, when the distance changes by every $\lambda/2$ ($\lambda$ is wavelength), the oscillation spectrum varies periodically. For example, when YAG crystal is used as the laser medium, the spectrum change is larger than 10 angstroms absorption spectrum width of YAG, and as a result the output of the solid state laser fluctuates significantly.

Recently, high output semiconductor lasers of single longitudinal mode have been advanced. The use of such semiconductor lasers as the excitation light source for a solid state laser has the advantage that the absorption efficiency and conversion efficiency of solid state laser increases, because the oscillation spectral width of the semiconductor laser is extremely narrow as compared with the absorption spectrum width of the solid state laser.

In FIG. 25, however, the AR coating applied on the end face 4a of the laser medium 4 such as Nd:YVO$_4$ or the like has a transmissivity of mere about T=93% to the wavelength of the semiconductor laser 1, and return light to the semiconductor laser 1 is caused, which may disturb the oscillation mode of the semiconductor laser 1. In particular, in the case where a semiconductor laser of single longitudinal mode is used for the semiconductor laser 1, if return light to the semiconductor laser 1 occurs, large mode hopping or multiplexing of longitudinal mode is caused, and larger output fluctuation is caused as compared with the case of using a semiconductor laser of multiple mode.

As a countermeasure against such problems, for the purpose of stabilizing the wavelength of single longitudinal mode semiconductor laser, a short wavelength SHG light source using a diffraction grating as an external mirror has been reported (Japanese Unexamined Patent Publication JPA 6-75261(1994)). However, the output of the single longitudinal mode semiconductor laser is only about 100 mW at the present, it is insufficient for solid state laser excitation of high output. Accordingly, by using a multiple mode broad area semiconductor laser, if a multiple mode semiconductor laser is capable of being oscillated stably in a single longitudinal mode, high outputs and wavelength stability can be achieved even in the case where the multiple mode semiconductor laser is used.

FIG. 27 is a schematic structural diagram showing another example of a conventional short wavelength light source. The light radiated from a semiconductor laser 1 is transformed into a collimated beam by a collimating lens 2, passes through an isolator 8, and is condensed through a condenser lens 3 into a nonlinear optical crystal 5 such as KTP, where the wavelength is converted and second harmonic waves are radiated.

Usually a antireflection (AR) coating for a fundamental wave is applied to surfaces 5a, 5b of the nonlinear optical crystal 5, but mere 0.1% or less return light is caused, and mode jump occurs in the semiconductor laser 1. Measures against the return light may include:

1) use of an isolator 8 for shutting off all but specified polarized light, 2) enhancement of performance of the AR coating on the incident end face of the nonlinear optical crystal 5, and 3) off-axial reflection by inclination of the nonlinear optical crystal 5.

However, 1) since the isolator 8 is expensive and large-sized, downsizing of the whole light source is difficult. Moreover, the isolator 8 is not practical because the drift of wavelength due to the temperature changes of the semiconductor laser 1 itself cannot be prevented. 2) Enhancement of performance of AR coating is difficult in view of the present coating technology. 3) To use the isolator 8 and to obliquely dispose the nonlinear optical crystal 5 may be expected to be effective to some extent as a method for cutting the return light. However, when the current of the semiconductor laser 1 is modulated in pulses and is directly modulated, the oscillation wavelength is not stable and oscillation wavelength fluctuation is observed every pulse. Especially in the case of wavelength conversion, such oscillation wavelength fluctuation directly leads to SHG intensity noises. Accordingly, in practical use, it is necessary to modulate at a high speed by using an external modulator, while continuously oscillating the semiconductor laser and generating CW (continuous wave) light, and which causes to increase the size and cost of the light source.

In the optical communications field, the semiconductor laser is required to oscillate always stably in single wavelength and single longitudinal mode regardless of ambient temperature changes. Additionally, for use in wavelength multiplex communications or the like, a variable wavelength laser capable of changing the oscillation wavelength is demanded.

FIG. 28A is a schematic structural diagram showing an example of a variable wavelength light source using an external resonator type semiconductor laser, and FIG. 28B is its partial perspective view. The light radiated from a semiconductor laser 1 is transformed into a collimated beam by a collimating lens 2, and passes through a phase shifter 9 using liquid crystal, penetrates through a birefringence filter 10 composed of a birefringence element such as LiNbO$_3$ and a polarized beam splitter, and is radiated from an output mirror 6 constituting the external resonator. It has been reported that by adjusting the voltage applied to a liquid crystal 9 the wavelength can be swept continuously with single mode oscillation (J. R. Andrews, Optics Letters, 16, 732, 1991).

From a viewpoint of output or wavelength stability it is realistic to use a high output semiconductor laser of longitudinal multiple mode as the semiconductor laser for solid state laser excitation, but the oscillation spectrum changes significantly due to effects of return light, and thereby the excitation efficiency of the solid state laser is lowered or efficiency fluctuation occurs in the course of time.

As for wavelength conversion devices using a LD, such as an single-pass SHG device, the wavelength stability of the semiconductor laser is quite important for the stability of their output power. Since the wavelength torelance of the nonlinear crystal (typically 1–3 Å) is narrower than the longitudinal mode hopping range of LD (typically ~10 Å), the change of wavelength deteriorates the conversion efficiency of the nonlinear crystal critically.

As for LD pumped solid state laser, such as fundamental laser, an intracavity-SHG, sum-frequency laser and difference-frequency laser the mode hopping of pumping LD changes the amount of absorption, which causes changes the fundamental circulating power, resulting in a fluctuation of fundamental or SHG or sum- or difference-frequency output power.

Thus, the wavelength stabilization of LD is essential for the output stabilization of wavelength conversion devices.

SUMMARY OF THE INVENTION

It is hence a primary object of the invention to provide a wavelength stabilized light source having a semiconductor laser of multiple longitudinal mode expanded more than the absorption spectrum of a solid state laser, which is capable of oscillating in single longitudinal mode while maintaining the high outputs, small in size, superior in efficiency, and excellent in wavelength stability.

The invention provides a wavelength stabilized light source comprising:

a semiconductor laser for oscillating laser light, a wavelength selecting element having a band pass characteristic that the transmissivity of specified wavelength light is increased, reflection means for applying optical feedback to the semiconductor laser through the wavelength selecting element, and a wavelength converting element for converting the wavelength of the laser light sequentially passing through the wavelength selecting element and the reflection means from the semiconductor laser, wherein the oscillation wavelength of the semiconductor laser is stabilized within a wavelength allowance of the wavelength converting element.

According to the invention, by applying optical feedback to the semiconductor laser through the wavelength selecting element, the semiconductor laser oscillates at a specific wavelength specified by the wavelength selecting element, and consequently a laser light of single longitudinal mode is obtained. Therefore, by stabilizing the oscillation wavelength of the semiconductor laser within the wavelength allowance of the wavelength converting element, the output light of second harmonic wave or sum- or difference-frequency is stabilized. Incidentally the reflection means stated above and below includes total reflection means which reflects 100% of incident light and partial reflection means which partially reflects 0% to 100% of incident light.

The invention also provides a wavelength stabilized light source comprising:

a semiconductor laser for oscillating excitation light, a wavelength selecting element having a band pass characteristic that the transmissivity of specified wavelength light is increased, reflection means for applying optical feedback to the semiconductor laser through the wavelength selecting element, and an optical resonator containing a laser medium to be excited by excitation light and a nonlinear optical element for wavelength conversion, wherein the oscillation wavelength of the semiconductor laser is stabilized within the absorption spectrum of the laser medium.

According to the invention, by applying an optical feedback to the semiconductor laser through the wavelength selecting element, the semiconductor laser oscillates at a specific wavelength specified by the wavelength selecting element, and hence a laser light of single longitudinal mode is obtained. Therefore, by stabilizing the oscillation wavelength of the semiconductor laser within the absorption spectrum of the laser medium, the laser oscillation by the laser medium is stabilized, and the light of the short wavelength generated from the nonlinear optical element is also stabilized.

The invention also provides a wavelength stabilized light source comprising:

a first semiconductor laser for oscillating excitation light, a second semiconductor laser for oscillating mixing light, a wavelength selecting element having a band pass characteristic that the transmissivity of specified wavelength light is increased, an optical resonator containing a laser medium to be excited by excitation light and a nonlinear optical element for wavelength conversion, and reflection means for applying optical feedback to the first and second semiconductor lasers through the wavelength selecting element.

According to the invention, by applying optical feedback to the first and second semiconductor lasers through the wavelength selecting element, the first and second semiconductor lasers oscillate at a specific wavelength specified by the wavelength selecting element, and hence two single longitudinal mode laser lights differing in wavelength are obtained. Therefore, as the oscillation wavelengths of the first and second semiconductor lasers are stabilized, the nonlinear light such as sum frequency light generated from the nonlinear optical element is also stabilized.

The invention also provides a wavelength stabilized light source comprising:

a semiconductor laser for oscillating excitation light;

a laser medium for emitting fundamental wave laser light after being excited by light of a predetermined wavelength within the range of wavelength of the excitation light;

an optical resonator including the laser medium;

a wavelength selecting element composed of polarization means and a birefringence element, the wavelength selecting element giving priority of transmission to the light of the predetermined wavelength of the excitation light; and reflection means for applying optical feedback to the semiconductor laser through the wavelength selecting element.

According to the invention, excitation light of single longitudinal mode can be obtained because the semiconductor laser oscillates at a specified wavelength specified by the wavelength selecting element by applying optical feedback to the semiconductor laser through the wavelength selecting element. Consequently the wavelength of the fundamental wave laser light generated in the laser medium is stabilized.

The invention provides a wavelength stabilized light source comprising:

a semiconductor laser for oscillating laser light, a nonlinear optical element for wavelength transconversion of a laser light of a predetermined wavelength within the wavelength range of the laser light and emitting short wavelength laser light;

a wavelength selecting element composed of polarization means and a birefringence element, the wavelength selecting element giving priority of transmission of the light of the predetermined wavelength of the laser light; and reflection means for applying optical feedback to the semiconductor laser through the wavelength selecting element.

According to the invention, laser light of single longitudinal mode can be obtained because the semiconductor laser oscillates at a specified wavelength specified by the wavelength selecting element by applying optical feedback to the semiconductor laser through the wavelength selecting element. Consequently the wavelength of the short wavelength laser light generated in the nonlinear optical element is stabilized.

The invention provides a wavelength stabilized light source comprising:

a semiconductor laser for oscillating excitation light;

a laser medium for emitting fundamental wave laser light by being excited by light of a predetermined wavelength within the range of wavelength of the excitation light;

a nonlinear optical element for converting the wavelength of the fundamental wave laser light and emitting short wavelength laser light;

an optical resonator including the laser medium and the nonlinear optical element;

a wavelength selecting element composed of polarization means and a birefringence element, the wavelength selecting element giving priority of transmission to the light of the predetermined wavelength of the excitation light; and reflection means for applying optical feedback to the semiconductor laser through the wavelength selecting element.

According to the invention, excitation light of single longitudinal mode can be obtained because the semiconductor laser oscillates at a specified wavelength specified by the wavelength selecting element by applying optical feedback to the semiconductor laser through the wavelength selecting element. Further, the wavelength of the short wavelength laser light generated in the nonlinear optical element as well as that of the fundamental wave laser light generated in the laser medium is stabilized.

The invention also provides a wavelength stabilized light source comprising:

a first semiconductor laser for oscillating excitation light;

a second semiconductor laser for oscillating mixing light;

a laser medium for emitting fundamental wave laser light by being excited by light of a predetermined wavelength within the range of wavelength of the excitation light;

a nonlinear optical element for emitting laser light of a certain wavelength by mixing the fundamental wave laser light and the mixing light;

an optical resonator including the laser medium and the nonlinear optical element;

a wavelength selecting element composed of polarization means and a birefringence element, the wavelength selecting element giving priority of transmission to the light of the predetermined wavelength of the excitation light; and reflection means for applying optical feedback to the first semiconductor laser through the wavelength selecting element.

According to the invention, excitation light of single longitudinal mode can be obtained because the first semiconductor laser oscillates at a specified wavelength specified by the wavelength selecting element by applying optical feedback to the first semiconductor laser through the wavelength selecting element. Further, the wavelength of the fundamental wave laser light generated in the laser medium excited by the first semiconductor laser. Consequently nonlinear laser light such as sum frequency light and difference frequency light generated in the nonlinear optical element is also stabilized.

The invention also provides a wavelength stabilized light source comprising:

a first semiconductor laser for oscillating excitation light;

a second semiconductor laser for oscillating mixing light;

a laser medium for emitting fundamental wave laser light by being excited by light of a predetermined wavelength within the range of wavelength of the excitation light;

a nonlinear optical element for emitting laser light of a certain wavelength by mixing the fundamental wave laser light and the mixing light;

an optical resonator including the laser medium and the nonlinear optical element;

a wavelength selecting element composed of polarization means and a birefringence element, the wavelength selecting element giving priority of transmission to the light of the predetermined wavelength of the excitation light; and reflection means for applying optical feedback to the second semiconductor laser through the wavelength selecting element.

According to the invention, mixing light of single longitudinal mode can be obtained because the second semiconductor laser oscillates at a specified wavelength specified by the wavelength selecting element by applying optical feedback to the second semiconductor laser through the wavelength selecting element. Consequently non-linear laser light such as sum frequency light and difference frequency light generated in the nonlinear optical element is also stabilized.

It is preferable in the invention that an end face of the first semiconductor laser from which the excitation light outgoes is butt-coupled with an end face of laser medium into which the excitation light incidents. Such construction of butt-coupling the end face from which the excitation light of the first semiconductor laser outgoes with the end face of the laser medium into which the excitation light incidents makes the distance between both end faces extremely small. For instance, in the case where a lens for condensing the excitation light of the semiconductor laser into the laser medium is inserted between both end surfaces, the distance between both end faces is about 10 cm, while being 100 μm or less in the case of such butt-coupling. The smaller the distance is, the smaller the distance change due to the thermal expansion caused by the temperature changes of a table supporting the semiconductor laser and laser medium is. As a result phase changes at the time when a part of the laser light radiated from the semiconductor laser is reflected on a surface of the laser medium and returns to the semiconductor laser are negligible even in the case where the environment temperature has changed. Accordingly the stability of oscillation wavelength is increased to make the intensity changes of the fundamental wave laser in the resonator very small. Since the sum frequency laser output is proportional to the product of the fundamental wave intensity in the resonator and the mixing light intensity, the stability of the sum frequency laser output is improved owing to stabilization of the fundamental wave laser intensity in the resonator.

Additionally, since the temperature changes caused by fundamental wave absorption of a nonlinear optical material remain at a constant value and are stable, the optical length (=length * refractive index) changes caused by thermal expansion and refractive index changes also becomes small. Consequently, the optical length changes of the optical path that mixing light radiated from the semiconductor laser which oscillates the mixing light passes through the nonlinear optical material, reflects on a certain face, and returns to the semiconductor laser for oscillating mixing light is relatively small and the stability of the oscillation wavelength of the semiconductor laser for oscillating mixing light is enhanced, resulting in that the sum frequency laser output is further stabilized in cooperation with the stability of the above-mentioned fundamental wave laser light.

Additionally the butt-coupling of the semiconductor laser for oscillating excitation light with the laser medium realizes size reduction of the light source.

The invention also provides a wavelength stabilized light source comprising:

a first semiconductor laser for oscillating excitation light;

a second semiconductor laser for oscillating mixing light;

a laser medium for emitting fundamental wave laser light by being excited by light of a first predetermined wavelength within the range of wavelength of the excitation light;

a nonlinear optical element for emitting laser light of a certain wavelength by mixing light of a second predetermined wavelength within the range of wavelength of the mixing light and the fundamental wave laser light;

an optical resonator including the laser medium and the non-linear optical element;

a first wavelength selecting element composed of polarization means and a birefringence element, the first wavelength selecting element giving priority of transmission to the light of the first predetermined wavelength of the excitation light;

first reflection means for applying optical feedback to the first semiconductor laser through the first wavelength selecting element;

a second wavelength selecting element composed of polarization means and a birefringence element, the second wavelength selecting element giving priority of transmission to the light of the second predetermined wavelength of the excitation light; and second reflection means for applying optical feedback to the second semiconductor laser through the second wavelength selecting element.

According to the invention, excitation light of single longitudinal mode and mixing light of single longitudinal mode can be obtained because the first and second semiconductor lasers oscillate at respective specified wavelengths specified by the first and second wavelength selecting elements by applying optical feedback to the first and second semiconductor lasers through the first and second wavelength selecting elements. Further, the wavelength of the fundamental wave laser light generated in the laser medium excited by the first semiconductor laser. Consequently non-linear laser light such as sum frequency light and difference frequency light generated in the nonlinear optical element transforming element is also stabilized.

It is preferable in the invention that the polarization means is included in the semiconductor laser to which the optical feedback is applied. Thereby total size and weight reduction of the apparatus can be realized.

It is preferable in the invention that the semiconductor laser to which the optical feedback is applied has a quantum well structure.

In other words, it makes TM (transverse-magnetic) mode oscillation difficult that there is little gain of polarization component (TM mode) in the vertical direction of the active layer in the semiconductor laser having a quantum well. As a result, only occurrence of TE (transverse-electric) mode oscillation dominates and therefore the semiconductor laser functions equivalently to a polarizer in the TE mode direction.

It is preferable in the invention that the wavelength selecting element is a birefringence filter of Lyot containing a birefringence element and a polarizer.

Namely, the wavelength selecting element is a birefringence filter of Lyot containing a birefringence element and a polarizer, and thereby a filter having a steep band pass characteristic can be easily obtained. Additionally, since the partial reflection means is a surface reflective coating, which is formed on the surface of optical element, an extra device such as a partial reflection mirror is not needed.

It is preferable in the invention that the wavelength selecting element is a birefringence filter whose birefringence element is inclined to the optical axis by a Brewstar angle.

Also, by using a birefringence filter composed plural birefringence elements differing in thickness inclined to the optical axis by Brewster angle as the wavelength selecting element, a filter having a steep bandpass characteristic can be easily obtained and wavelength tuning is facilitated. Additionally since the partial reflection means is a surface reflective coating, which is formed on the surface of the optical element, an extra device such as a partial reflection mirror is not needed.

It is preferable in the invention that the birefringence element used in the wavelength selecting element is a liquid crystal.

Namely, by using a liquid crystal as the birefringence element included in the wavelength selecting element, control of birefringence rate by an applied voltage is simplified as well as wavelength tuning is facilitated.

It is preferable in the invention that the birefringence element used in the wavelength selecting element is a crystal composed of non-doped $YVO_4$ or $KNbO_3$.

Namely by using a crystal composed of non-doped $YVO_4$ or $KNbO_3$ as the birefringence element included in the wavelength selecting element, a filter characteristic of high performance is obtained.

It is preferable in the invention that the laser medium has a birefringent property, and is used as birefringence element of the wavelength selecting element.

Namely, by using a laser medium having a birefringent property to use as a birefringence element of wavelength selecting element, the optical element can be shared as well as size reduction can be totally reduced.

It is preferable in the invention that the nonlinear optical element has a birefringent property and is used as a birefringence element of the wavelength selecting element.

Namely, by using a nonlinear optical element having a birefringent property to use as birefringence element of wavelength selecting element, the optical element can be shared as well as the entire size can be reduced.

The invention provides a wavelength stabilized light source comprising:

a semiconductor laser for oscillating fundamental light;

a wavelength selecting element having a band pass characteristic that the transmissivity of specified wavelength light is increased;

a nonlinear optical element for generating harmonic waves by converting the wavelength of a fundamental wave having passed through the wavelength selecting element; and fundamental wave reflection means for reflecting the fundamental wave passed through the nonlinear optical element and applying optical feedback to the semiconductor laser through the wavelength selecting element; and harmonic wave reflection means for superposing the harmonic waves generated by the nonlinear optical element in one direction.

Also according to the invention, by applying optical feedback to the semiconductor laser through the wavelength selecting element, the semiconductor laser oscillates at a specific wavelength specified by the wavelength selecting element, so that laser light of single longitudinal mode is obtained. Moreover, by superposing the harmonic waves generated by the nonlinear optical element in one direction, the optical intensity of the harmonic waves is additionally increased, so that the conversion efficiency of the harmonic waves can be enhanced.

The principle of the invention will be described below. FIG. 1 is a perspective view showing an example of a birefringence filter of Lyot. This birefringence filter is composed by disposing a birefringence element 22 between two polarizers 21 and 23, and the axes of polarization 21a, 23a of the polarizers 21, 23 are set vertically above the optical axis, and the direction of the principal axis 22a of the birefringence element 22 is inclined in a direction of an angle of 45° to the axes of polarization 21a, 23a, which is known as a birefringence filter of Lyot (Lyot and Oman).

Referring to refractive indices of the birefringence element 22 to ordinary light and extraordinary light as no and ne, respectively, wavelength as λ, and thickness of birefringence element 22 as d, the phase difference Γ of ordinary light to extraordinary light is $$\Gamma = (2\pi/\lambda) \cdot (ne - no) \cdot d$$

and the transmissivity T of the entire filter is $$T = (\tfrac{1}{2}) \cdot \cos^2(\Gamma/2)$$

FIG. 2 is a perspective view showing another example of birefringence filter of Lyot according to the invention. In this birefringence filter, in order to narrow the band of filter characteristic, N pieces of birefringence elements 22 having a thickness sequentially doubled such as d, 2d, 4d, 8d and so forth are disposed, and are arranged in N stages in series across a polarizer 21. At this time, the overall transmissivity is expressed as $$T = \frac{1}{2} \cos^2\left(\frac{\Gamma}{2}\right) \cos^2\left(2\frac{\Gamma}{2}\right) \cos^2\left(4\frac{\Gamma}{2}\right) \ldots \cos^2\left(2^{N-1}\frac{\Gamma}{2}\right)$$

FIG. 3 is a perspective view showing a practical example of a birefringence filter of Lyot. This birefringence filter is composed by disposing a polarizer 24 such as polarizing beam splitter between two birefringence elements 22 having a thickness d1 of 1 mm and a thickness d2 of 2 mm, made of non-doped $VYO_4$ crystal, and the laser light radiated from a semiconductor laser 20 passes through the birefringence filter, and is reflected by an external mirror 25, passes again through the birefringence filter, and is fed back to the semiconductor laser 20 as TE mode, and in this way optical feedback is applied. The refractive indices of the $YVO_4$ crystal to ordinary light and extraordinary light at an oscillation wavelength of 810 nm of the semiconductor laser 20 are no=1.985 and ne=2.202, respectively.

FIG. 4 is a graph showing the wavelength dependency of quantity of light being fed back to the semiconductor laser 20. The solid line indicates the two-way transmissivity of the birefringence filter, and the broken line denotes the gain curve of the semiconductor laser 20. As known from FIG. 4, at wavelengths of 808.6 nm and 814.2 nm, a steep band pass characteristic with a transmissivity of about 1 is presented. Therefore, considering together with the gain curve of the semiconductor laser 20, a single mode oscillation at wavelength 808.6 nm is expected.

When a semiconductor laser is used in a high output status by increasing an injection current into the semiconductor laser, oscillation may occur even in plural wavelengths at intervals of a wavelength depending on the bandpass cycle of the birefringence filter in other positions in addition to the gain center due to increase of gain. In this case, it is necessary to lengthen the bandpass cycle of the birefringence filter and set so that only one peak of the bandpass occurs within the gain width.

FIGS. 4A and 4B show the difference of bandpass characteristics in two cases, one case in which a 1 mm thick non-doped $YVO_4$ plate and a 2 mm thick non-doped $YVO_4$ plate are combined, another case in which a 0.5 mm thick non-doped $YVO_4$ plate and a 1 mm thick non-doped $YVO_4$ plate are combined. When the semiconductor laser is driven in a considerably higher current than an oscillation threshold, it is possible that in the combination of the 1 mm thick plate and the 2mm thick plate (FIG. 4A), oscillation occurs at wavelengths such as peaks P1 and P3 in addition to the gain center peak P2. As shown in FIG. 4B, when the thicknesses of the plates are made thinner (e.g., 0.5 mm and 1.0 mm, respectively), the bandpass cycle is lengthened, which makes oscillation at only the gain center peak P2 possible.

FIG. 5 and FIG. 6 are graphs explaining the wavelength stabilizing mechanism of a semiconductor laser with optical feedback. First in FIG. 5, in an ordinary semiconductor laser the wavelength dependence of optical loss is small, and it is regarded to be an almost constant value. By increasing the injection current into the semiconductor laser, the carrier and the gain increase, and laser oscillation starts in a wavelength region in which the gain curve surpasses the loss curve. In this wavelength region, plural oscillation lines may be established at every longitudinal mode interval determined by the resonator length.

In FIG. 6, when only the light in a specific wavelength region is selectively fed back through the birefringence filter, it is the same as when the reflectivity of the resonator mirror is increased at just a specific wavelength, so that the loss relating to the specific wavelength decreases abruptly. Therefore, only at a specific wavelength, the gain curve surpasses the loss curve, so that single mode oscillation or multiple mode oscillation of several oscillation lines may be realized.

To realize such filter characteristic actually, the following two points are important. It is first important to match the peak positions of filter characteristic at each stage. For this purpose, referring to the thickness of the birefringence element of the first stage as d, the thickness the birefringence element of the second stage must be adjusted precisely to $2d$ in the wavelength order.

FIG. 7 is a graph showing the effects of thickness error of each birefringence element 22. In this graph, supposing to use non-doped $YVO_4$ as the birefringence element 22 in FIG. 3, the solid line shows the filter characteristic at ideal thickness with the first element thickness of 1.0 mm and second element thickness of 2.0 mm, and the single dot chain line refers to a filter characteristic of 1 $\mu$m thicker than the ideal thickness. The broken line denotes the gain curve of the semiconductor laser. As known from the graph, if the thickness of the second element is deviated by about 1 $\mu$m from $2d$, the filtering characteristic deteriorates significantly. This is because the peak wavelength of the first stage filter curve and the peak position of the second stage are deviated. Therefore, to realize an ideal filter characteristic, it is necessary to process the thickness of the birefringence element 22 with high precision. Actually, however, polishing with such high precision is difficult, and some kind of tuning mechanism is needed.

As such a tuning mechanism, an angle tuning method of varying the incident angle by inclining the birefringence element 22, and a temperature turning method of varying the temperature of the birefringence element 22 are known.

Now, setting up coordinates as shown in FIG. 8, placing the optical axis on the z-axis (=a-axis), and referring to the incident angle of light on x-y plane as θ, and the angle from the x-axis (fast-axis) along the direction of polarization to be φ, the phase difference is expressed as follows.

$$\Gamma = \frac{2\pi d}{\lambda}(ne-no)\left\{1 - \frac{\sin^2\theta}{2 \cap no^2}(1-2\cos^2\phi)\right\}$$

FIG. 9 is a graph showing the result of calculation of first stage filter characteristic when the birefringence element 22 of thickness of 2 mm composed of $YVO_4$ crystal is inclined about the a-axis. In FIG. 9, almost one cycle can be shifted by inclining by 5° from the vertical incidence angle of θ=0°, and it is found to be sufficient practically.

When the light propagation axis coincides with the principal axis (in the case of vertical incidence θ=0°), if rotated about the z-axis, the peak waveform of the filter transmission curve is not shifted. However, when entering by slightly inclining the crystal (θ≠0°), the peak wavelength can be shifted by rotating the crystal about the z-axis.

A second important point is the resolution when filtering in a narrow wavelength range, and to keep a high resolution, the incident beam must be formed into parallel beam. As understood from FIG. 9, to keep the resolution of 1 angstrom, the expanse of the incident angle must be kept within about 1°.

As such birefringence filter not sensitive to incident angle variance, a configuration as shown in FIG. 10B is also known ("Optical Wave in Layered Media," P. Yeh Jhon & Willey 1988). In FIG. 10A, a birefringence element 22 element is interposed between two polarizers 21, which is same as the constitution in FIG. 1. In FIG. 10B, instead of one birefringence element 22 of crystal thickness of d, two birefringence elements 22a, 22b composed of crystal of thickness d/2 are used, and the axes of small principal refractive index (fast-axes) of the birefringence elements 22a, 22b are disposed orthogonally, and a λ/2 plate (half-wavelength plate) 26 is disposed between the two birefringence elements 22a, 22b, and in principle it is intended to cancel the angle variance by separating one birefringence element 22 into two and exchanging the polarization.

In this constitution, the relation between the wavelength resolution $\Delta\lambda_{1/2}$ and beam divergence angle θ is expressed as follows.

$$\theta = \pm no \cdot \left| \frac{2 \cdot no \cdot \Delta\lambda_{1/2}}{\lambda \cdot \Delta n} \right|^{1/2}$$

Herein, supposing λ=8100 angstroms, $\Delta\lambda_{1/2}$=0.5 angstrom, no=1.985, and ne=2.202, we obtain θ=4°, and a high resolution is realized at a relatively wide divergence angle.

FIG. 11 is a structural diagram showing an other example of birefringence filter. As the basic constitution of Lyot filter, the polarizer and birefringence element are needed, but, as shown in FIG. 11, the polarizer may be omitted by using the birefringence element at an inclination of Brewster angle.

Generally, referring to the material refractive index as n and incident angle as θi, of the light entering at an incident angle of tan θi=n, the polarized component (S polarized light) in the vertical direction (vertical to the sheet of paper) in the incident plane is reflected partly, but the polarized component (P polarized light) parallel in the incident plane is not reflected but is transmitted entirely. This angle is called Brewster angle. By using near this angle, it is possible to separate by polarization by making use of the difference in transmissivity of P polarized light and S polarized light, so that the polarizer may be omitted.

FIG. 12 is a graph showing the relation between incident angle to the birefringence element 22 and transmissivity. In this graph, using non-doped $YVO_4$ as birefringence element 22, considering the angle dependence of the refractive index, the incident angle dependence of transmissivity per surface of P polarized light and S polarized light is calculated. Near the incident angle of 66°, as shown in the graph, the transmissivity of P polarized light is maximum (100%), and the transmissivity of S polarized light at this time is about 50%.

In the configuration of two birefringence elements 22 disposed at Brewster angle as shown in FIG. 11, the light passes eight times the surfaces inclined at Brewster angle in forward and backward paths from the semiconductor laser through the birefringence filter to the semiconductor laser. Therefore, the transmissivity of the P polarized light and S polarized light is respectively 0.3% and 100%, the values are sufficient for practical use.

BRIEF DESCRIPTION OF THE DRAWINGS

Other and further objects, features, and advantages of the invention will be more explicit from the following detailed description taken with reference to the drawings wherein:

FIG. 10A is a view showing a configuration wherein the birefringence element 22 is interposed between two polarizers 21;

FIG. 10B is a view showing a configuration wherein placing a λ/2 plate 25 between two birefringence elements 22a, 22b composed of crystal having a thickness of d/2;

FIG. 11 is a structural diagram showing another example of a birefringence filter;

FIG. 15A is a graph in the case where optical feedback is applied to a semiconductor laser 30, and FIG. 15B is a graph in the case where optical feedback is not applied;

FIG. 23A is a graph in the case where output stabilization was not been conducted, and FIG. 23B is a graph in the case where output stabilization was conducted;

DETAILED DESCRIPTION OF THE PREFERRED EMBODIMENTS

Figure 1:
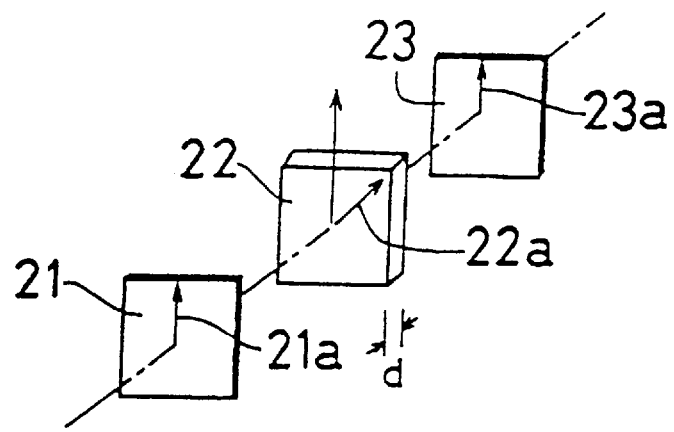
FIG. 1 is a perspective view showing an example of Lyot birefringence filter of the invention.
Figure 2:
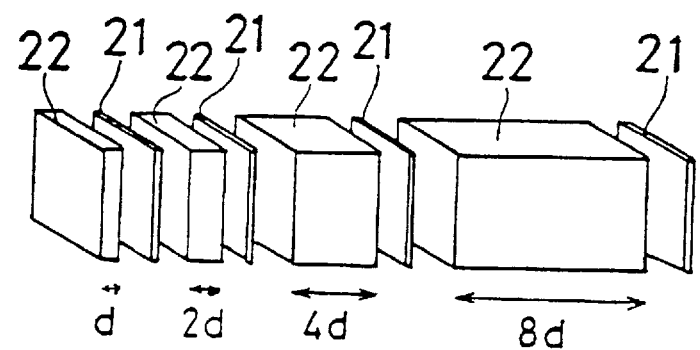
FIG. 2 is a perspective view showing another example of Lyot birefringence filter of the invention.
Figure 3:
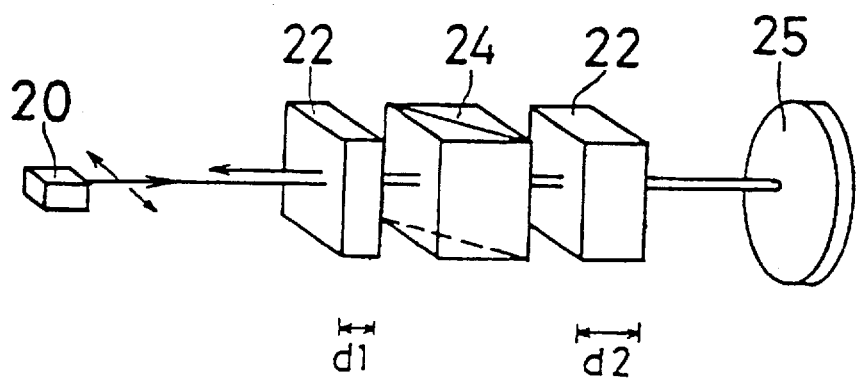
FIG. 3 is a perspective view showing a practical example of Lyot birefringence filter.
Figure 4:
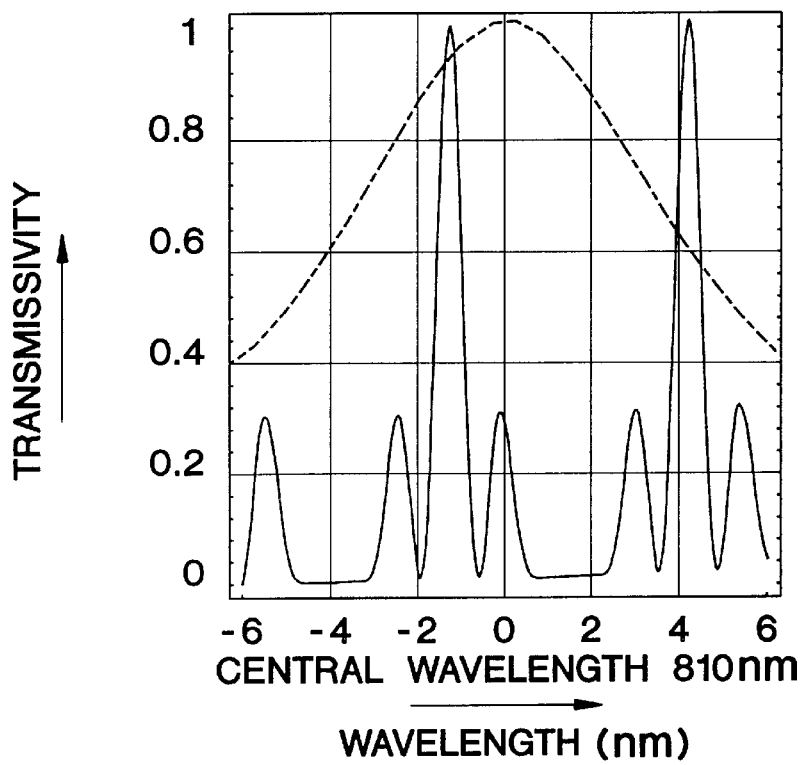
FIGS. 4, 4A and 4B are graphs showing wavelength dependence of quantity of light feeding back to a semiconductor laser 20.
Figure 4A:
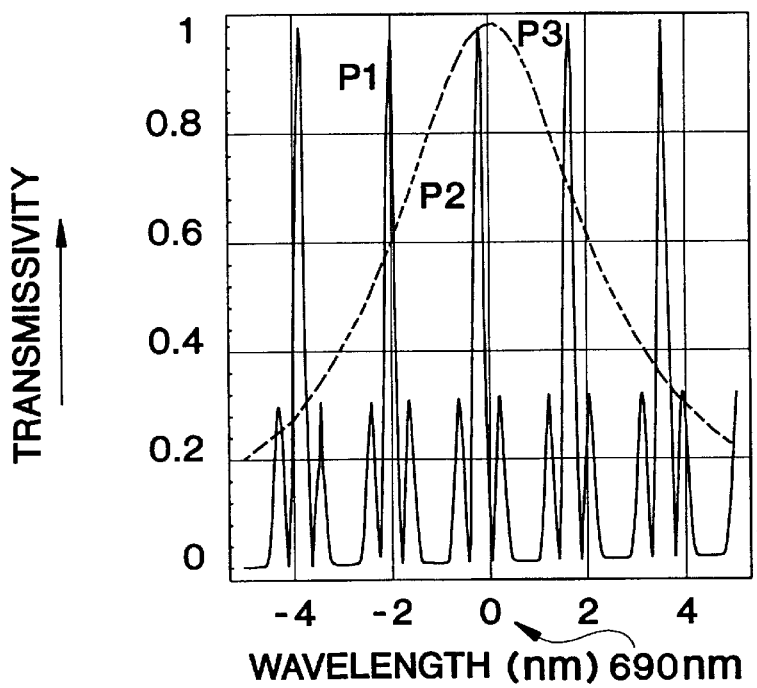
Figure 4B:
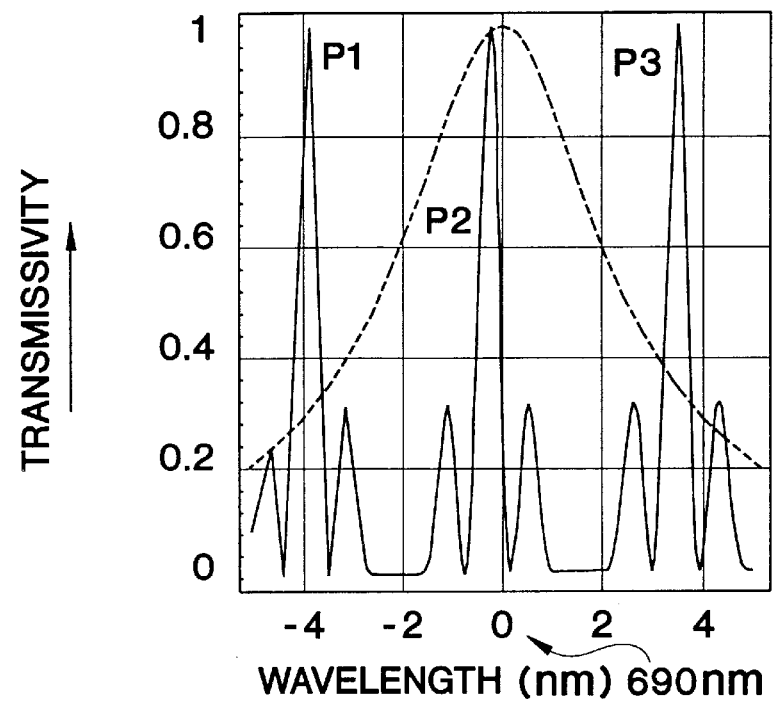
Figure 7:
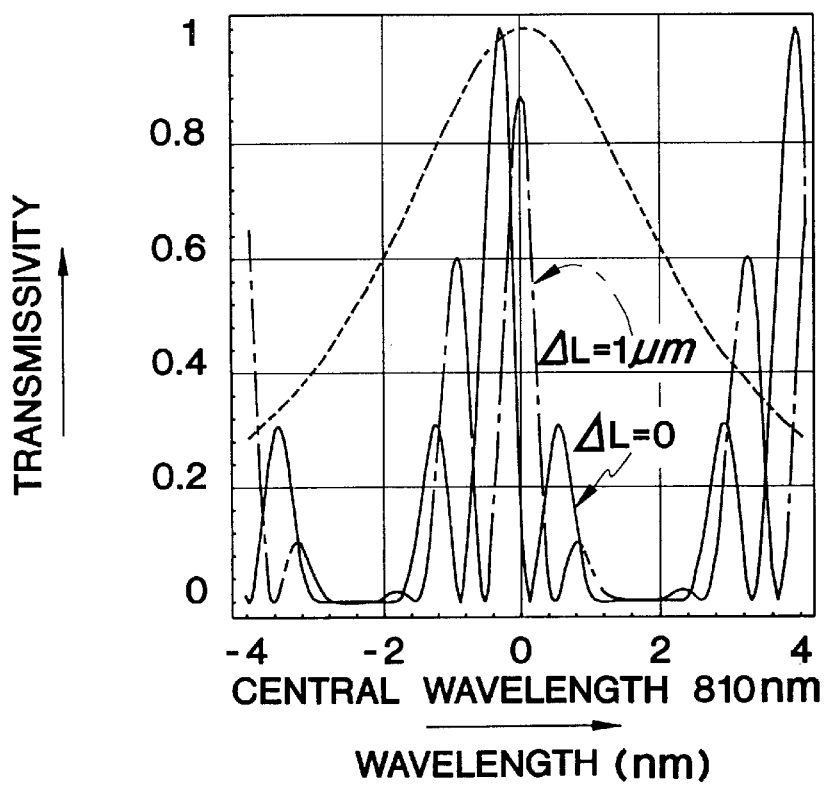
FIG. 7 is a graph showing effects of thickness errors of birefringence elements 22.
Figure 5:
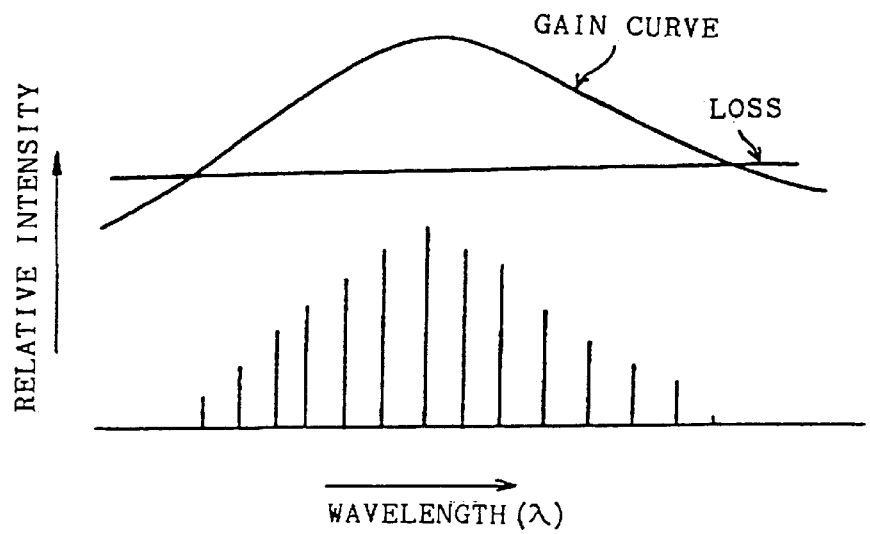
FIG. 5 is a graph explaining a wavelength stabilizing mechanism of semiconductor laser with optical feedback.
Figure 6:
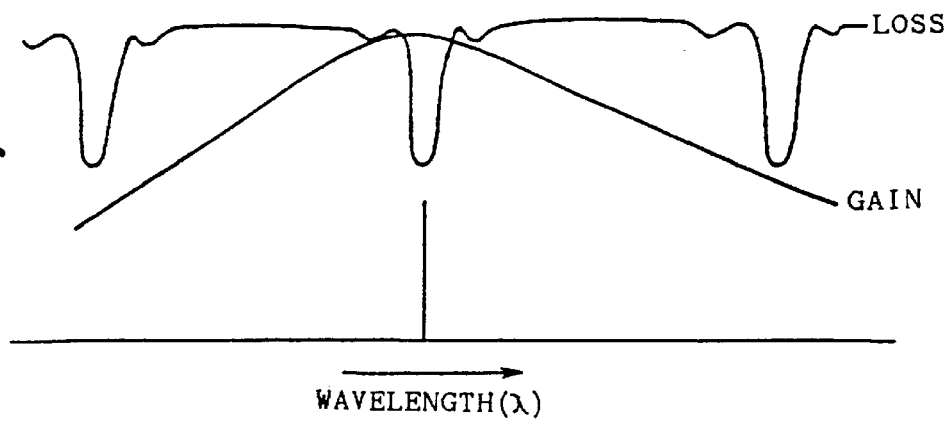
FIG. 6 is a graph explaining a wavelength stabilizing mechanism of semiconductor laser with optical feedback.
Figure 8:
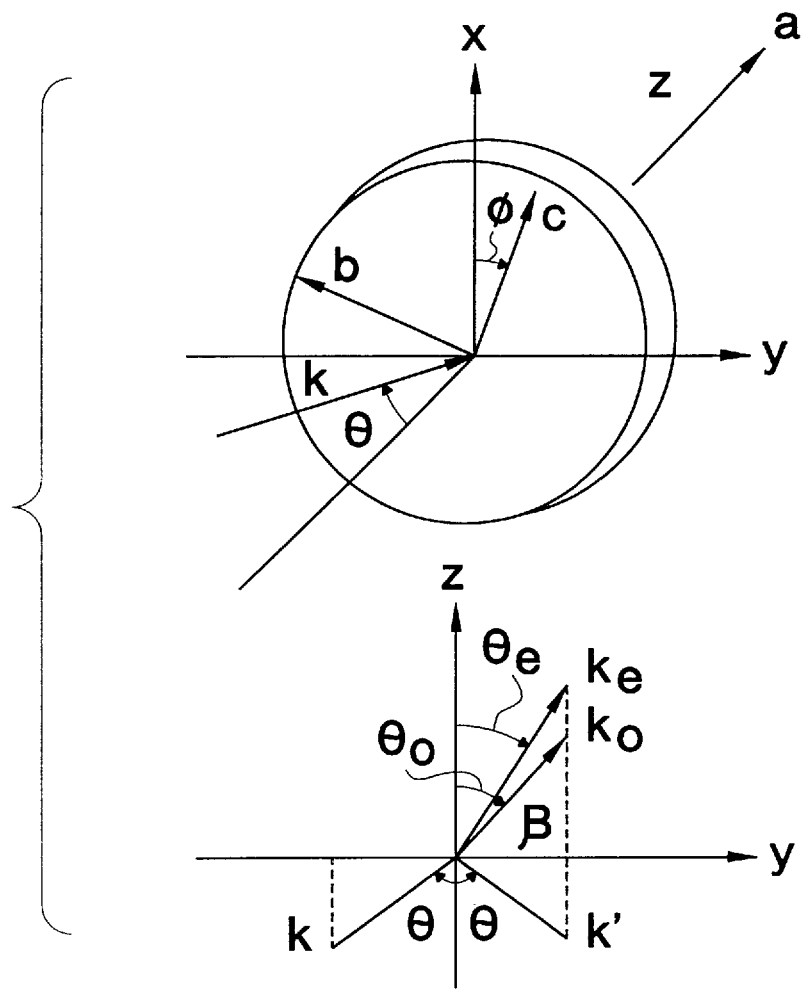
FIG. 8 is a diagram showing a system of coordinates.

Now referring to the drawings, preferred embodiments of the invention are described below.

(Embodiment 1)

Figure 13:
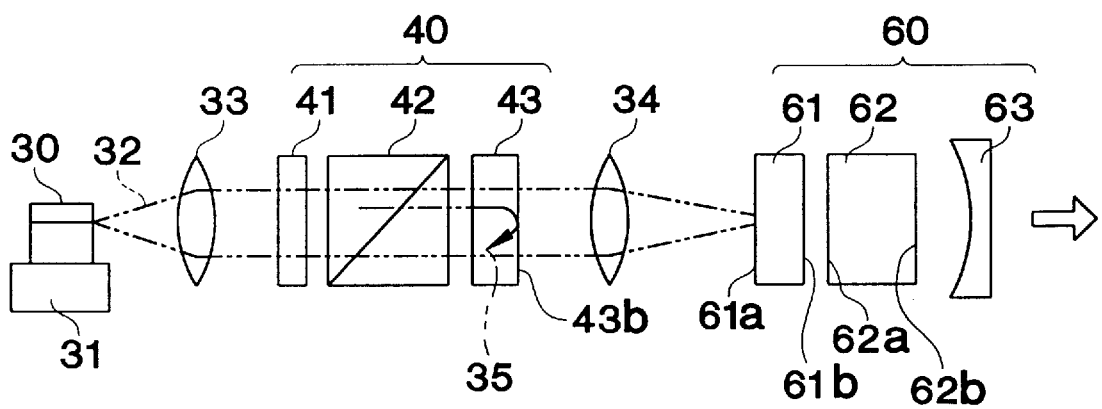
FIG. 13 is a structural diagram showing a first embodiment of the invention.
Figure 9:
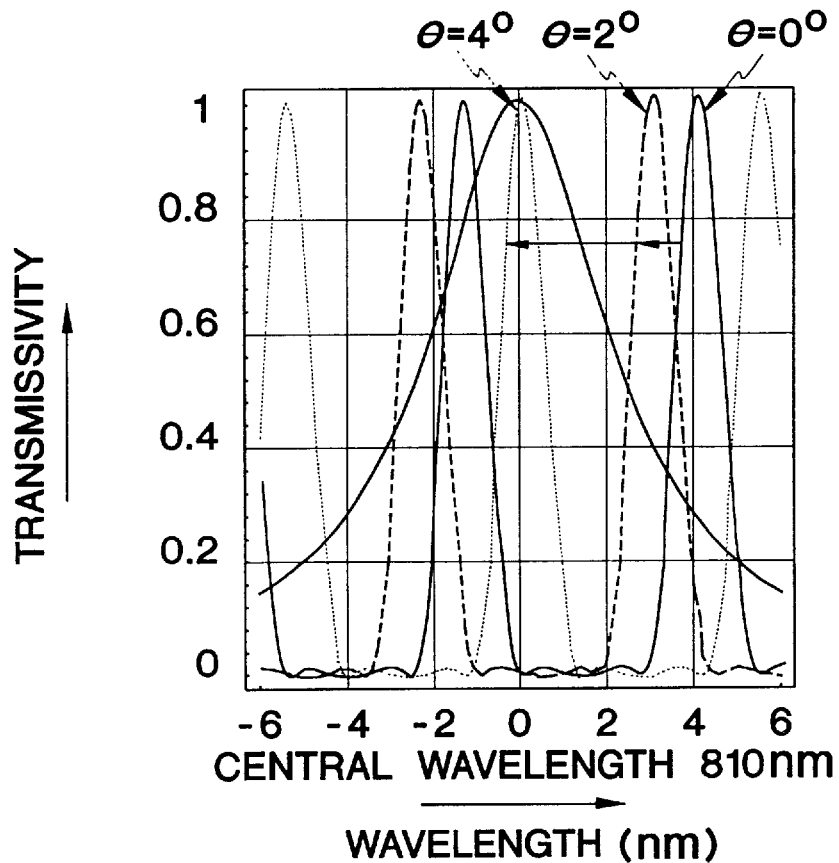
FIG. 9 is a graph showing calculation results of one-stage filter characteristics when a birefringence element 22a having a thickness of 2 mm composed of $YVO_4$ crystal is inclined about a-axis.
Figure 12:
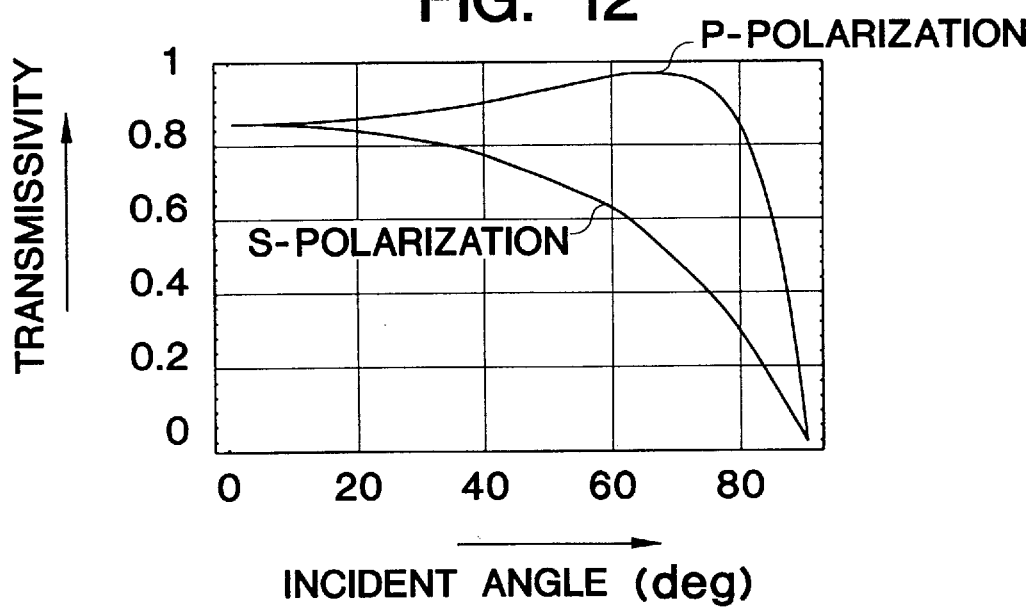
FIG. 12 is a graph showing the relation of incident angle to the birefringence element 22 and transmissivity.

FIG. 13 is a structural diagram showing a first embodiment of the invention. This short wavelength light source is composed of a semiconductor laser for excitation, a solid state laser of internal resonator type containing a laser medium and SHG crystal, and others.

The short wavelength light source comprises a semiconductor laser (SLD-322XT supplied by Sony) 30 for pumping a laser medium 61, a birefringence filter 40 for controlling and stabilizing the wavelength by applying an optical feedback for feeding back only light of specific wavelength to the semiconductor laser 30, lens systems 33, 34 (F-L20 supplied by Newport) for focusing the pumping light 32, and an optical resonator 60 containing a laser medium 61 composed of Nd:YAG (yttrium aluminium garnet) doped with 1% of Nd and a nonlinear optical element 62 composed of KNbO$_3$. The surface 61b of the laser medium 61 and the surface 62a of the nonlinear optical element 62 contact with each other.

The semiconductor laser 30 for pumping is mounted on a Peltier element 31, and is stabilized at a specified temperature by a temperature regulating circuit (not shown). The KNbO$_3$ used as the nonlinear optical element 62 has an a–b cut (θ=90°, φ=60°), and is disposed at an angle for satisfying the phase matching of type I at 946 nm wavelength.

The birefringence filter 40 is composed as a Lyot type filter, comprising a birefringence element 41 formed of non-doped YVO$_4$ with a thickness of 2 mm, a polarizer 42 such as polarizing beam splitter, and a birefringence element 43 formed of non-doped YVO$_4$ with a thickness of 4 mm.

On the surfaces of the collimating lens 33, condenser lens 34, and parts 41 to 43 of birefringence filter 40, a antireflection (AR) coating at 809 nm oscillation wavelength of excitation semiconductor laser 30 is applied. Besides, on the surface 43b of the birefringence element 43 facing the optical resonator 60, a partial reflection coating is applied so that the reflectivity may be 20% at 809 nm wavelength. Therefore, the pumping light 32 from the semiconductor laser 30 passes through the birefringence filter 40, and is partly reflected on the surface 43b of the birefringence element 43 to generate a return light 35, and it further passes through the birefringence filter 40, and only a specific wavelength is fed back to the semiconductor laser 30. Accordingly, the output of the pumping light 32 is hardly changed, and a laser oscillation close to single mode at a specific wavelength is realized.

The surface 61a of the laser medium 61 is coated so that the reflectivity at 946 nm oscillation wavelength of the laser medium 61 may be 99.9% and that the transmissivity at 809 nm wavelength of the pumping light 32 may be 95% or more. The output mirror 63 has a reflectivity of 99.9% or more at 946 nm wavelength, and has a transmissivity of 80% at the second harmonic wave of 473 nm wavelength. Thus is composed the optical resonator 60 for 946 nm wavelength by the surface 61a of the laser medium 61 and the output mirror 63.

Moreover, on the surface 61b of the laser medium 61 facing the nonlinear optical element 62, and both surfaces 62a, 62b of the nonlinear optical element 62, an antireflection (AR) coating is applied so that the transmissivity at 946 nm wavelength may be 99.9% or more.

The operation is described below. The direction of polarization of pumping light 32 radiated from the semiconductor laser 30 coincides with the vertical direction of the optical axis within the sheet of paper. When the pumping light 32 is focused by the lens 34 and enters the laser medium 61, an inverted distribution is formed in the laser medium 61, and laser oscillation at 946 nm wavelength occurs in the optical resonator 60. When the oscillated light at 946 nm wavelength passes through the nonlinear optical crystal 62, the wavelength is converted to generate a 473 nm wavelength second harmonic wave, which is radiated outside from the output mirror 63.

The semiconductor 30 for excitation oscillates in the multiple mode at a wavelength width of about 15 angstroms without the birefringence filter 40, that is, in so-called free-running state, but oscillates nearly in the single mode at a wavelength width of about 1.5 angstroms when optical feedback is conducted by the return light 35.

Figure 14:
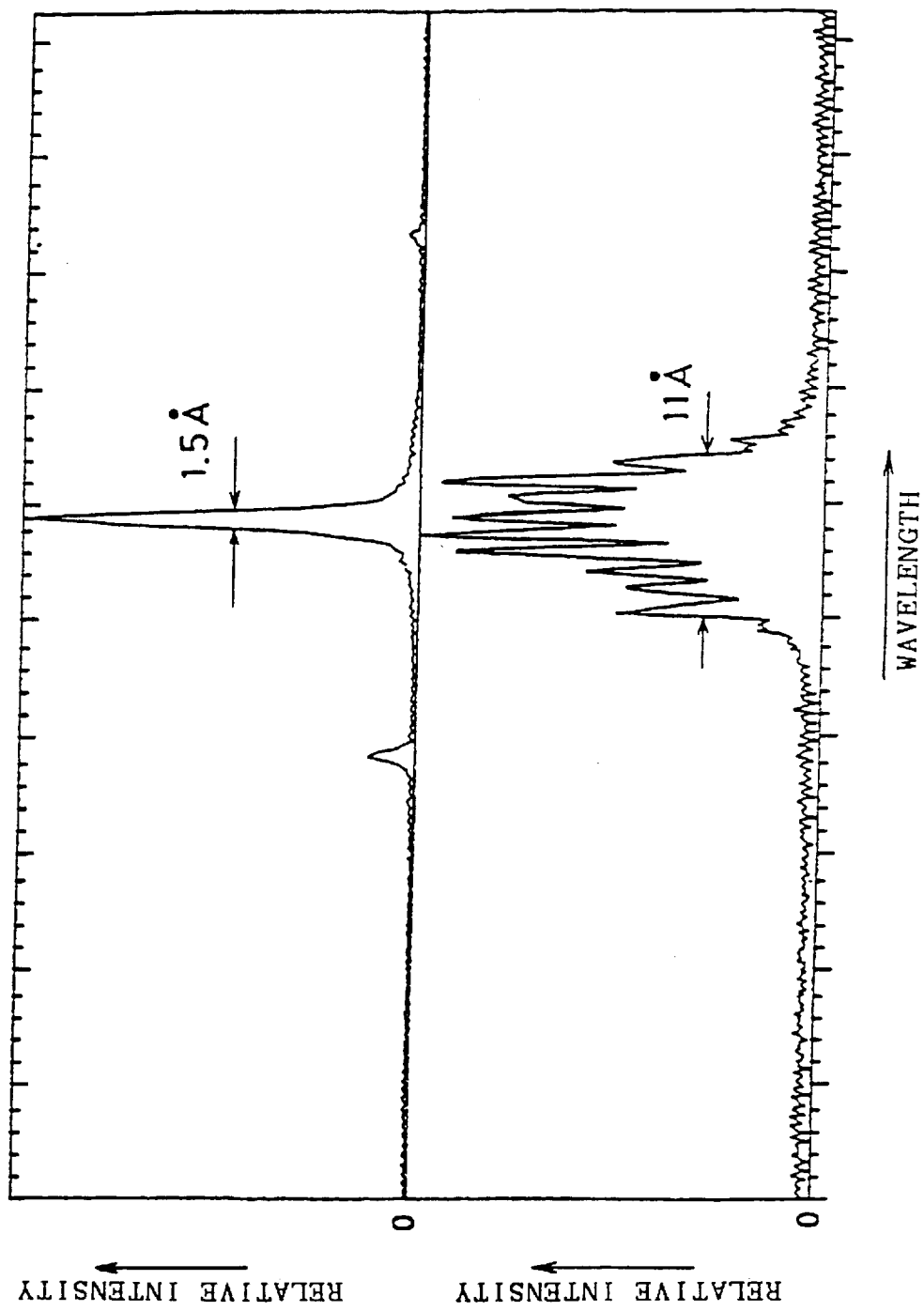
FIG. 14 shows two graphs showing oscillation spectrum of semiconductor laser 30, with optical feedback applied in the upper graph, and without optical feed back in the lower graph.

FIG. 14 is graphs showing an oscillation spectrum of a semiconductor laser 30, the upper graph of which relates to the case where optical feedback is applied, and the lower graph of which relates to the case where optical feedback is not applied. When optical feedback is applied, the oscillation spectrum of the semiconductor laser 30 does not jump largely relative to the phase change of the return light 35 caused by thermal expansion or the like, and it only jumps to a very close adjacent external resonance mode existing within a wavelength width of 1.5 angstroms. Therefore, it is extremely small as compared with the absorption line width of 10 angstroms of YAG of the laser medium 61, and the absorption efficiency hardly changes, so that the solid state laser oscillates stably.

Figure 15A:
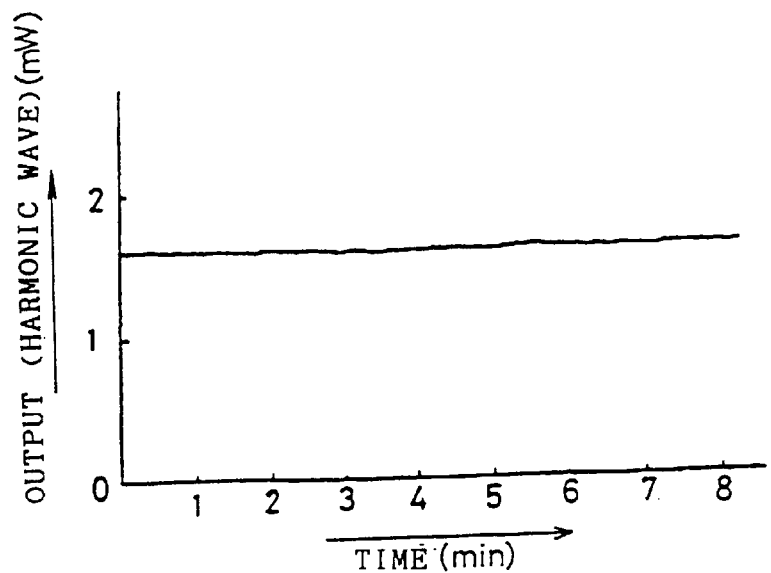
FIGS. 15A and 15B show two graphs showing output fluctuations of a short wavelength light source.
Figure 15B:
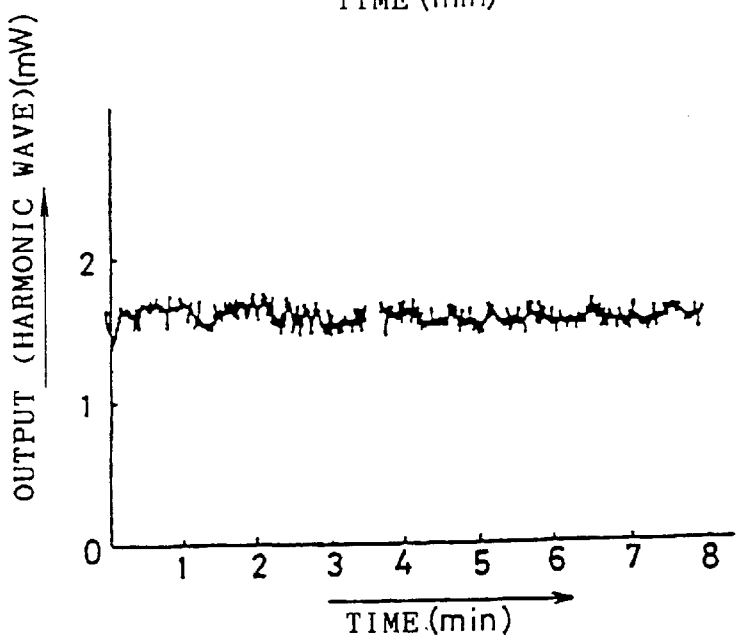

FIGS. 15A and 15B are graphs showing output fluctuations of a short wavelength light source, FIG. 15A is a graph in the case where optical feedback is applied to a semiconductor laser 30, and FIG. 15B is a graph in the case where optical feedback is not applied. In FIG. 15A, there is almost no fluctuation in the second harmonic wave output at 473 nm wavelength, and it is a practically tolerable level, and when the laser medium 61 is excited at 400 mW, short wavelength light of an output of 5 mW is stably obtained at 473 nm wavelength. In FIG. 15B, on the other hand, the second harmonic wave output is largely changed stepwise, and output fluctuations due to mode jump of the semiconductor laser 30 are observed.

In the first embodiment, the reflection means for optical feedback is arranged on the end face 43b of the birefringence filter. The reflection means also may be arranged on the face 61a of the laser medium 61 in lieu of the end face 43b.

(Embodiment 2)

Figure 16:
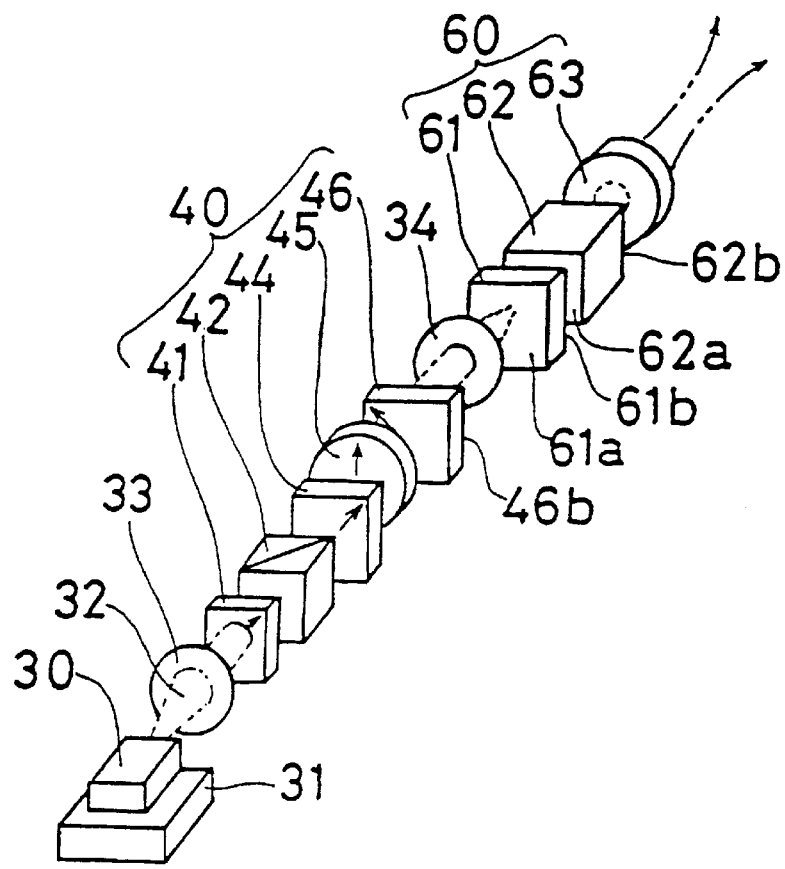
FIG. 16 is a structural diagram showing a second embodiment of the invention.

FIG. 16 is a structural diagram showing a second embodiment of the invention. This short wavelength light source is the same as in FIG. 13, composed essentially of a semiconductor laser for excitation and a solid state laser of internal resonator type containing a laser medium and a SHG crystal. As explained in FIG. 10, it is intended to realize a high wavelength resolution, while relaxing the incident angle dependence on the birefringence filter. In this embodiment, the same elements as those shown in the first embodiment are denoted by the same reference numerals, and duplicate explanations are omitted.

Instead of the second birefringence element 43 shown in FIG. 13, a λ/2 plate 45 is interposed between two birefringence elements 44, 46 of half thickness. On the optical resonator side surface 46b of the birefringence element 46, a partial reflection coating is applied so that the reflectivity at 809 nm oscillation wavelength of the semiconductor laser 30 may be 20%, and optical feedback is applied to the semiconductor laser 30.

In this constitution, although the number of parts of the birefringence filter 40 increases slightly, allowable deviation of incident angle is increased with the result that an extremely high wavelength resolution is realized. Consequently the wavelength stability of pumping light 32 from the semiconductor laser 30 is enhanced outstandingly.

Incidentally, the reflection means for optical feedback may be arranged on the face 61a of the laser medium in lieu of the end face 46b in the second embodiment.

(Embodiment 3)

Figure 17:
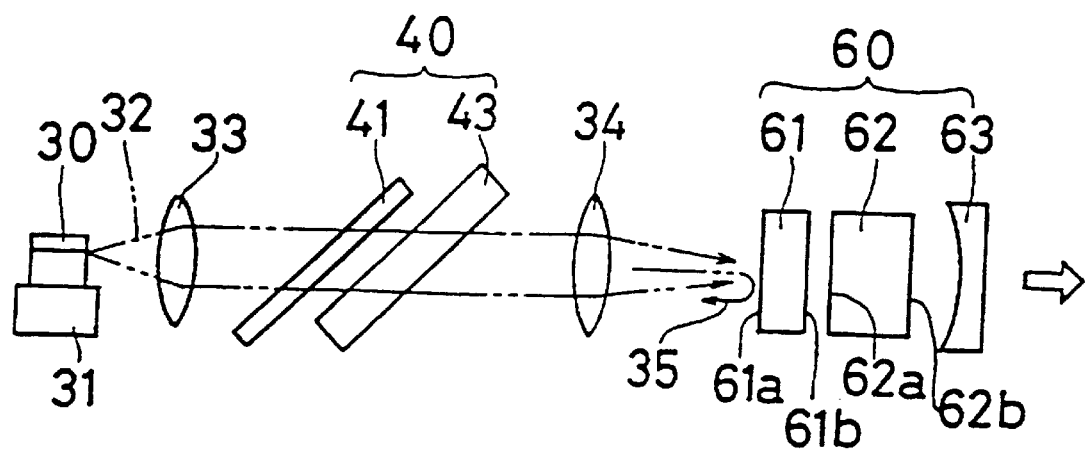
FIG. 17 is a structural diagram showing a third embodiment of the invention.

FIG. 17 is a structural diagram showing a third embodiment of the invention. This short wavelength light source is the same as in FIG. 13, composed essentially of a semiconductor laser for excitation and a solid state laser of internal resonator type containing a laser medium and a SHG crystal. As been explained in FIG. 11, the polarizer 42 is omitted by inclining the two birefringence elements 41, 43 at Brewster angle. In this embodiment, the same elements as those shown in the first embodiment are denoted by the same reference numerals, and duplicate explanations are omitted.

In FIG. 17, as birefringence elements 41, 43, 2 mm and 4 mm thick non-doped $YVO_4$ crystals are used, which are disposed at an inclination of about 65° from vertical incident direction at Brewster angle. To avoid mutual interference effect, the interval between two birefringence elements 41, 43 is set to be 1 mm or more.

The pumping light 32 of 809 nm wavelength emitted from the semiconductor laser 30 passes through the birefringence elements 41, 43, and is condensed on the laser medium 61 by the condenser lens 34. The incident side surface 61a of the laser medium 61 has an optical characteristic of a reflectivity of 5% at 809 nm wavelength, and a part of the pumping light 32 is reflected as return light 35, and passes through the birefringence elements 43, 41, and is fed back to the active layer of the semiconductor laser 30 as TE mode.

In this constitution, since the polarizer 42 is omitted by inclining the birefringence elements 41, 43 at Brewster angle, the number of parts can be curtailed while maintaining the filter characteristic.

(Embodiment 4)

Figure 18:
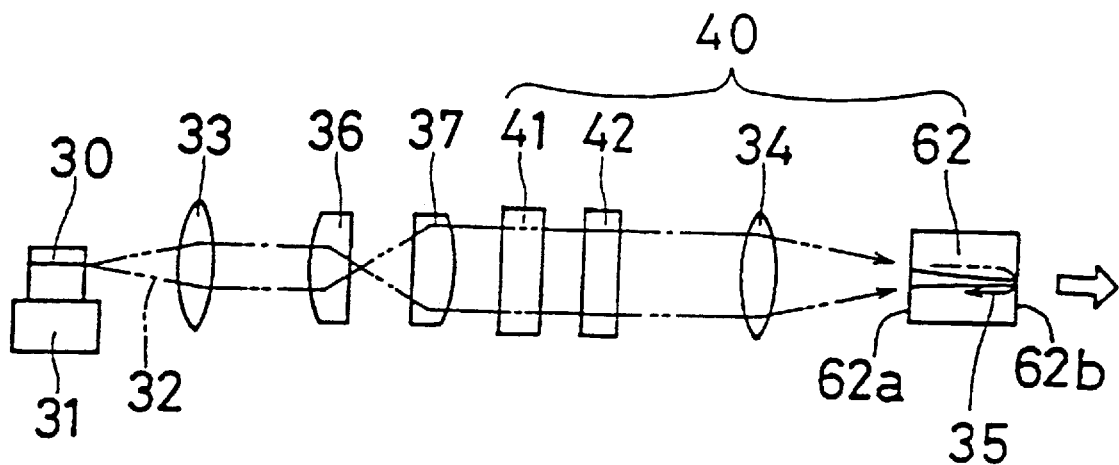
FIG. 18 is a structural diagram showing a fourth embodiment of the invention.

FIG. 18 is a structural diagram showing a fourth embodiment of the invention. This short wavelength light source is designed so as to generate second harmonic waves by direct conversion by passing the light 32 of single mode semiconductor laser 30 through a nonlinear optical crystal 62. As the birefringence element for composing the birefringence filter 40, the nonlinear optical element 62 is commonly used. In this embodiment, the same elements as those shown in the first embodiment are denoted by the same reference numerals, and duplicate explanations are omitted.

The light 32 emitted from the semiconductor laser 30 (SLD-7033 supplied by Sanyo) oscillating in a single mode of 860 nm wavelength becomes a parallel beam through a collimating lens 11, and the beam shape is further shaped into a circular form by a pair of cylindrical lenses 36, 37, and it enters the nonlinear optical crystal 62 constituting a part of the birefringence filter 40.

As the birefringence material 41, a 1 mm thick non-doped $YVO_4$ crystal is used. The birefringence material 41 shows different refractive indices on two axes of polarization orthogonal to the optical axis, and functions as the birefringence element of the birefringence filter 40.

As the nonlinear optical element 62, an a-axis cut $KNbO_3$ crystal of 5 mm in crystal length is used, and the incident side surface 62a has an antireflection (AR) coating at 860 nm wavelength, and the exit side surface 62b has a partial reflection coating so as to have 20% reflectivity at 860 nm wavelength. The nonlinear optical element 62 is a wavelength converting element, and also function as birefringence element of the birefringence filter 40 by entering by slightly inclining the direction of polarization of incident light from the b-axis.

Between the birefringence material 41 and the nonlinear optical element 62, polarizer 42 and condenser lens 34 are disposed. The light 32 passing through the birefringence material 41 and the polarizer 42 is condensed by the condenser lens 34 so that the beam waist may be positioned on the exit side surface 62b of the nonlinear optical element 62.

In this way, the birefringence filter 40 comprising the birefringence material 41, the polarizer 42 and the nonlinear optical element 62 is constituted. The light 32 passing through the birefringence filter 40 is partially reflected by the exit side surface 62b of the nonlinear optical element 62 to be return light 35, and passes again through the birefringence filter 40, and only a specific wavelength light is fed back to the semiconductor laser 30 as TE mode, thereby applying optical feedback. As a result, the laser oscillation of the semiconductor laser 30 is stabilized in the single mode, and hence the wavelength and the output power of the second harmonic waves delivered from the nonlinear optical crystal 62 may be stabilized.

(Embodiment 5)

Figure 19:
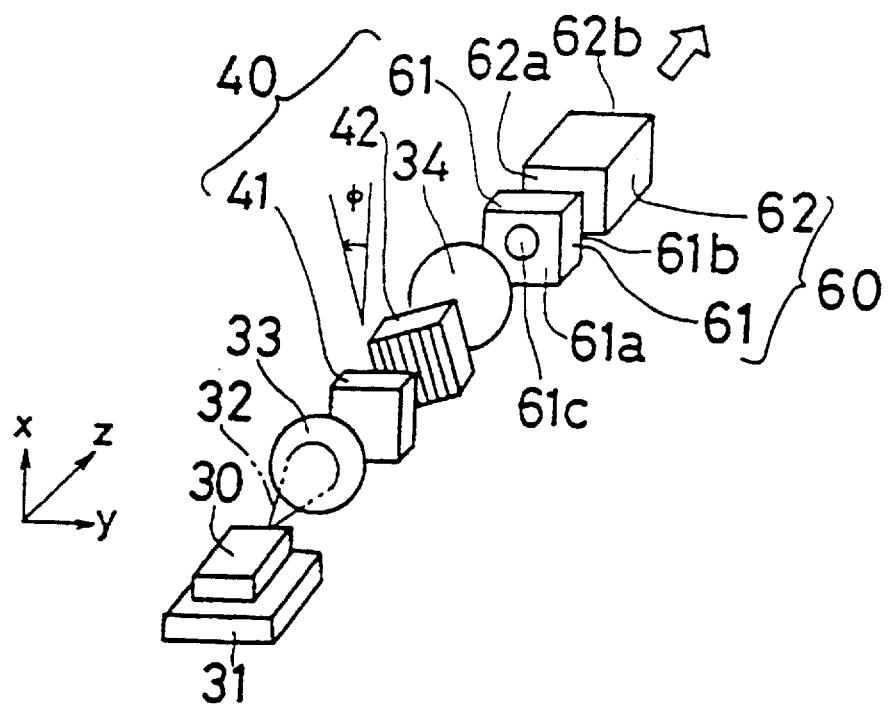
FIG. 19 is a structural diagram showing a fifth embodiment of the invention.

FIG. 19 is a structural diagram showing a fifth embodiment of the invention. This short wavelength light source is the same as in FIG. 13, composed essentially of a semiconductor laser for excitation and a solid state laser of internal resonator type containing a laser medium and a SHG crystal. It is an example of application into stabilization of a green light source, and the laser medium 61 is used commonly as the birefringence element for composing the birefringence filter 40.

The short wavelength light source mainly comprises a semiconductor laser (SLD-322XT supplied by Sony) 30 for pumping a laser medium 61, a birefringence filter 40 for controlling and stabilizing the wavelength by applying optical feedback for feeding back only light of a specific wavelength to the semiconductor laser 30, lens systems 33, (F-L20 supplied by Newport) for focusing the pumping light 32, and an optical resonator 60 formed of a laser medium 61 formed of $Nd:YVO_4$ doped with 1% of Nd and a nonlinear optical element 62 formed of KTP (Potassium Titanyl Phosphate), and the exit side surface 61b of the laser medium 61 and the incident side surface 62a of the nonlinear optical element 62 contact with each other.

The semiconductor laser 30 for pumping is mounted on a Peltier element 31, and is stabilized at a specific temperature by a temperature regulating circuit (not shown).

The birefringence filter 40 has a structure as Lyot filter, and is composed of a 1 mm thick birefringence element 41 made of non-doped $YVO_4$, a polarizer 42 inclined by an angle φ to vertical direction above the optical axis, and a 0.5 mm thick laser medium 61 made of $Nd:YVO_4$.

Near the center of the surface 61a of the laser medium 61, a tiny convex spherical surface 61c is formed at the incident side by fine processing technology utilizing photolithography, and its aperture radius is 80 μm and the radius of curvature is 12 mm. The laser medium 61 functions as a birefringence element of the birefringence filter 40 by slightly inclining the direction of polarization of incident light from the c-axis.

On the surfaces of the collimating lens 33, a condenser lens 34, and parts 41 and 42 of a birefringence filter 40, a antireflection (AR) coating at 809 nm oscillation wavelength of the semiconductor laser 30 is applied. Besides, a partial reflection coating is applied to the surface 61b of the laser medium 61 facing the nonlinear optical element 62 so that the transmissivity T of 1064 nm wavelength light is 99.9% or more and to the surface 61b so that the reflectivity of 809 nm wavelength light is 20%. Therefore, the pumping light 32 with the wavelength of 809 nm from the semiconductor laser 30 passes through the birefringence filter 40, and is partly reflected on the surface 61b of the laser medium 61 to generate return light 35, and it further passes through the birefringence filter 40, and only specific wavelength light is fed back to the semiconductor laser 30. Accordingly, the output of the pumping light 32 is hardly changed because of optical feedback, and a laser oscillation close to single mode at a specific wavelength is realized.

The surface 61a of the laser medium 61 is coated so that the reflectivity at 1064 nm oscillation wavelength of the laser medium 61 may be 99.9% and that the transmissivity at 809 nm wavelength of the pumping light 32 may be 98%.

Additionally, for secure wavelength control by a smaller feedback amount, the semiconductor laser with an anti-reflection coating so that the front surface reflectivity of the excitation semiconductor laser 30 for excitation may be about R=0.1% is used.

On the other hand, the KTP crystal used in the nonlinear optical element 62 is a crystal cut out at angle of θ=90° to the z-axis and direction of φ=23.8° to the x-axis, having a crystal thickness of 3 mm. At this cutting angle, phase matching of type 2 is possible for the wavelength 1064 nm.

The incident side surface 62a of the nonlinear optical element 62 has an antireflection coating having a transmissivity of 99.9% at 1064 nm wavelength and 809 nm wavelength, and the exit side surface 62b has an optical coating having a reflectivity of 99.98% at 1064 nm wavelength, and a transmissivity of 95% at 532 nm wavelength of second harmonic wave. Thus, the tiny spherical surface 61c formed on the surface 61a of the laser medium 61 functions as a concave mirror, and the exit side surface 62b of the nonlinear optical element 62 functions as a plane mirror, thereby composing the optical resonator 60 at 1064 nm wavelength.

The operation is described below. The direction of polarization of pumping light 32 radiated from the semiconductor laser 30 coincides with the y-axis. When the pumping light 32 passing through the birefringence filter 40 is focused by the lens 34 and passes through the tiny spherical surface 61c to enter the laser medium 61, an inverted population is formed in the laser medium 61, and laser oscillation at 1064 nm wavelength occurs in the optical resonator 60. When the oscillated light at 1064 nm wavelength passes through the nonlinear optical crystal 62, the wavelength is converted to generate second harmonic wave of wavelength 532 nm outside.

In such constitution, since the laser oscillation of the semiconductor laser 30 for excitation is stabilized by optical feedback of the pumping light 32, green light of 50 mW output can be obtained stably. Additionally, by using the laser medium 61 as part of the birefringence filter 40 in common, the number of parts can be curtailed.

(Embodiment 6)

Figure 20:
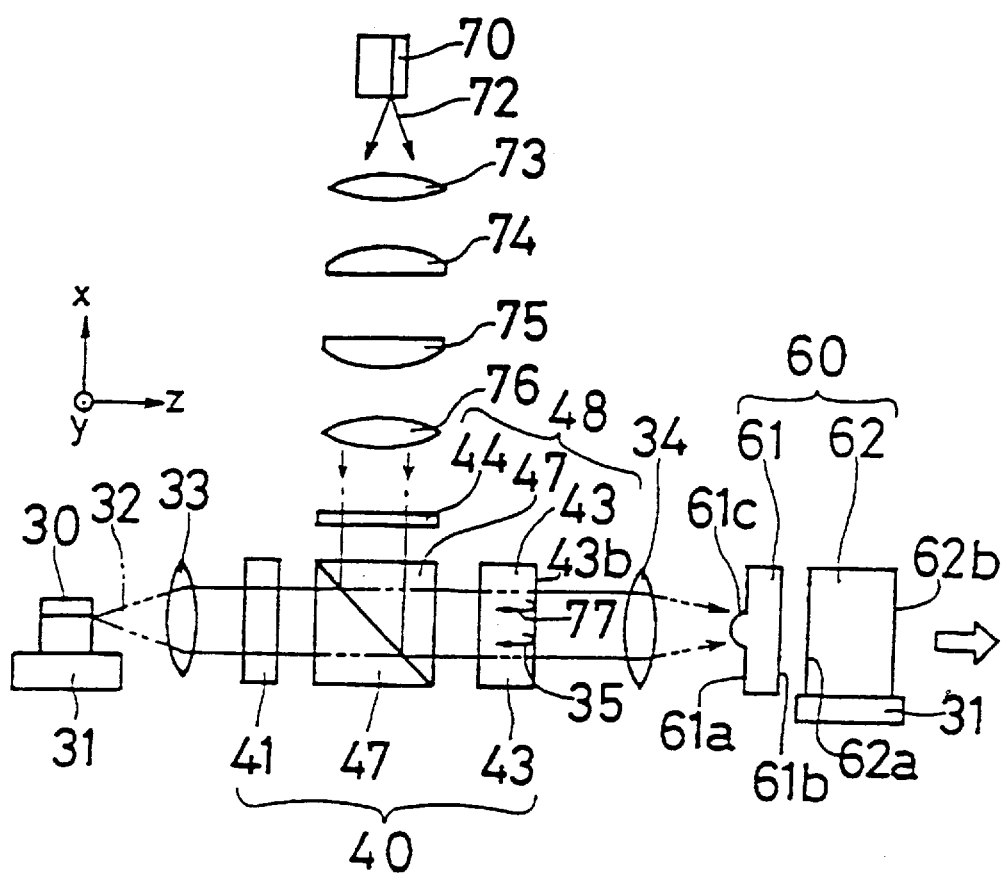
FIG. 20 is a structural diagram showing a sixth embodiment of the invention.

FIG. 20 is a structural diagram showing a sixth embodiment of the invention. The short wavelength light source mainly comprises two semiconductor lasers for excitation and mixing and a solid state laser of internal resonator type containing a laser medium and a nonlinear optical crystal. It is an example of application into stabilization of a blue light source by sum-frequency generation.

The short wavelength light source comprises a semiconductor laser for excitation (SLD-322XT supplied by Sony) 30 for radiating pumping light 32 of 809 nm wavelength for exciting laser medium 61, a semiconductor laser for mixing (TOLD9150 supplied by Toshiba) 70 for radiating mixing light 72 of 694 nm wavelength, a birefringence filter 40, 48 for stabilizing the wavelengths of semiconductor lasers 30 and 70, lens systems 33, 34, 73 to 76 for focusing the pumping light 32 or mixing light 72, and an optical resonator 60 composed of the laser medium 61 formed of Nd:YVO$_4$ doped with 1% of Nd and the nonlinear optical element 62 formed of KNbO$_3$, and the exit side surface 61b of the laser medium 61 and the incident side surface 62a of the nonlinear optical element 62 contact with each other.

The semiconductor laser 30 for pumping is mounted on a Peltier element 31, and is stabilized at a specific temperature by a temperature regulating circuit (not shown).

Near the center of the surface 61a of the laser medium 61, a convex tiny spherical surface 61c is formed at the incident side by fine processing technology utilizing photolithography, and its aperture radius is 80 μm and the radius of curvature is 12 mm.

The surface 61a of the laser medium 61 is coated to have a reflectivity of 99.9% at 1064 nm oscillation wavelength of laser medium 61, and a transmissivity of 95% or more at 809 nm wavelength of pumping light 32 and 694 nm wavelength of mixing light 72. The surface 61b of the laser medium 61 facing the nonlinear optical element 62 is coated to have a transmissivity T of 99.9% or more at 1064 nm wavelength, and a transmissivity of 95% or more at 694 nm wavelength.

On the other hand, the KNbO$_3$ crystal used for the nonlinear optical element 62 is a so-called a-axis crystal being cut out at an angle of θ=90° to the z-axis and in the direction of φ=0° to the x-axis, and the crystal thickness is 5 mm. This nonlinear optical element 62 is mounted on a Peltier element 31, and the phase matching is achieved by temperature tuning.

The incident side surface 62a of the nonlinear optical element 62 is coated to have a transmissivity of 99.9% at 1064 nm wavelength. Its exit side surface 62b has an optical coating to have a reflectivity of 99.98% at 1064 nm wavelength, and a transmissivity of 95% at 420 nm wavelength of sum-frequency light. Thus, the tiny spherical surface 61c formed on the surface 61a of the laser medium 61 functions as a concave mirror, and the exit side surface 62b of the nonlinear optical element 62 functions as a plane mirror, thereby composing an optical resonator 60 for 1064 nm wavelength.

On the other hand, mixing light 72 of 694 nm wavelength radiated from the semiconductor laser 70 (TOLD9150 supplied by Toshiba) is formed into a parallel beam by a collimating lens 73, and is shaped into a beam of a circular section by means of a pair of cylindrical lens 74, 75, and it passes through a lens 76 for adjustment of focal position, and is reflected by a polarizing beam splitter 47, thereby becoming coaxial with the optical axis of the pumping light 32.

The mixing light 72 of wavelength 694 nm which is a second fundamental wave is condensed by a condenser lens 34 so as to form a beam waist on the exit side surface 61b of the laser medium 61, and enters the nonlinear optical element 62. Both the directions of polarization of pumping light of wavelength 1064 nm which is a first fundamental wave and mixing light 72 of 694 nm wavelength which is a second fundamental wave introduced into the optical resonator 60 are set so as to be in y-axis direction of the nonlinear optical element 62 which is a KNbO$_3$ crystal. When the first and second fundamental waves are mixed in the nonlinear optical element 62, the output light converted to, 420 nm wavelength of sum-frequency light is emitted from the surface 62b of the nonlinear optical element 62.

The birefringence filters 40, 48 are described below. The birefringence filter 40 for stabilizing the wavelength of the semiconductor laser 30 for excitation is composed of a 2 mm thick birefringence element 41 formed of non-doped YVO$_4$ crystal, a polarizing beam splitter 47, and a 4 mm thick birefringence element 43 formed of non-doped YVO$_4$ crystal. The birefringence filter 48 for stabilizing the wavelength of the semiconductor laser 70 for mixing is composed of a 0.5 mm thick birefringence element 44 in thickness formed of non-doped YVO$_4$ crystal, a polarizing beam splitter 47, and the birefringence element 43. Therefore, the polarizing beam splitter 47 and birefringence element 43 are shared between by both birefringence filters 40, 48.

The exist side surface 43b of the birefringence element 43 has a partial reflection coating so as to have a reflectivity of 20% at 694 nm wavelength and 809 nm wavelength. Therefore, the pumping light 32 from the semiconductor laser 30 passes through the birefringence filter 40, and is partly reflected by the exit side surface 43b of the birefringence element 43, and passes again through the birefringence filter 40, thereby applying an optical feedback to the semiconductor laser 30, so that the, wavelength of the semiconductor laser 30 may be stabilized. On the other hand, the mixing light 72 from the semiconductor laser 70 passes through the birefringence filter 48, and is partly reflected by the exit side surface 43b of the birefringence element 43, and passes again through the birefringence filter 48, thereby applying an optical feedback to the semiconductor laser 70, so that the wavelength of the semiconductor laser 70 may be stabilized.

Thee reflection means for optical feedback to mixing light may also be arranged on the face 61a of the laser medium or the face 62b of the nonlinear optical element 62 in lieu of the end face 43b of the birefringence filter.

For example, when the output of the semiconductor laser 30 for excitation is 400 mW and the output of the semiconductor laser 70 for mixing is 30 mW, blue light of 420 nm wavelength may be stably obtained at 10 mW output as sum frequency light.

(Embodiment 7)

Figure 21:
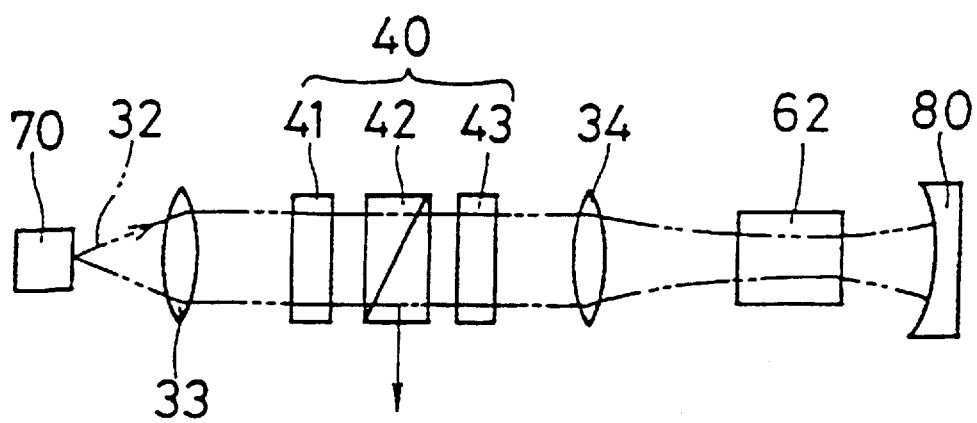
FIG. 21 is a structural diagram showing a seventh embodiment of the invention.

FIG. 21 is a structural diagram showing a seventh embodiment of the invention, and it is intended to convert the wavelength of single mode semiconductor laser light directly by a nonlinear optical crystal with high efficiency, and stabilize the oscillation wavelength of the semiconductor laser.

The principle of operation is described below. The fundamental wave light 32 emitted from a single mode semiconductor laser 70 is formed into a parallel beam by a collimating lens 33, and passes through a birefringence filter 40, and enters a nonlinear optical crystal 62 through a condenser lens 34. The fundamental wave light 32 passing through the nonlinear optical crystal 62 is reflected by a reflection mirror 80, and put again into the nonlinear optical crystal 62, and passes again through the birefringence filter 40, so that only a specific wavelength is optically fed back to the semiconductor laser 70. As a result, the semiconductor laser 70 can oscillate at a stable specific wavelength. Herein, the reflection mirror 80 is a mirror of total reflection to fundamental wave and harmonic wave.

At this time, the second harmonic wave is emitted to both right and left directions of the nonlinear optical crystal 62, but the second harmonic wave emitted to the right is reflected by the reflection mirror 80, and is superposed with the second harmonic wave emitted to the left, thereby forming an output of four times in power, which is emitted downward from the polarizing beam splitter 42. Usually, the second harmonic wave is generated in a specific phase relation to the phase of the fundamental wave, and assuming there is no change in the relative phase relation between the fundamental wave and second harmonic, wave on the reflection mirror 80, the added second harmonic waves cancel each other. Therefore, it is desired to use a reflection mirror fabricated and adjusted in reflection phase difference so that they may not cancel each other.

Using a single mode diode (SDL-5430-C supplied by SDL) with 860 nm wavelength and 200 mW output as the semiconductor laser 70, 2 mm and 5 mm thick non-doped YVO$_4$ as birefringence plates 41, 43, and KNbO$_3$ crystals of a-axis cut with 10 mm crystal length as nonlinear optical crystals 62, blue light of 430 nm wavelength of 1 mW output at 200 mW input could be stably obtained.

(Embodiment 8)

Figure 22A:
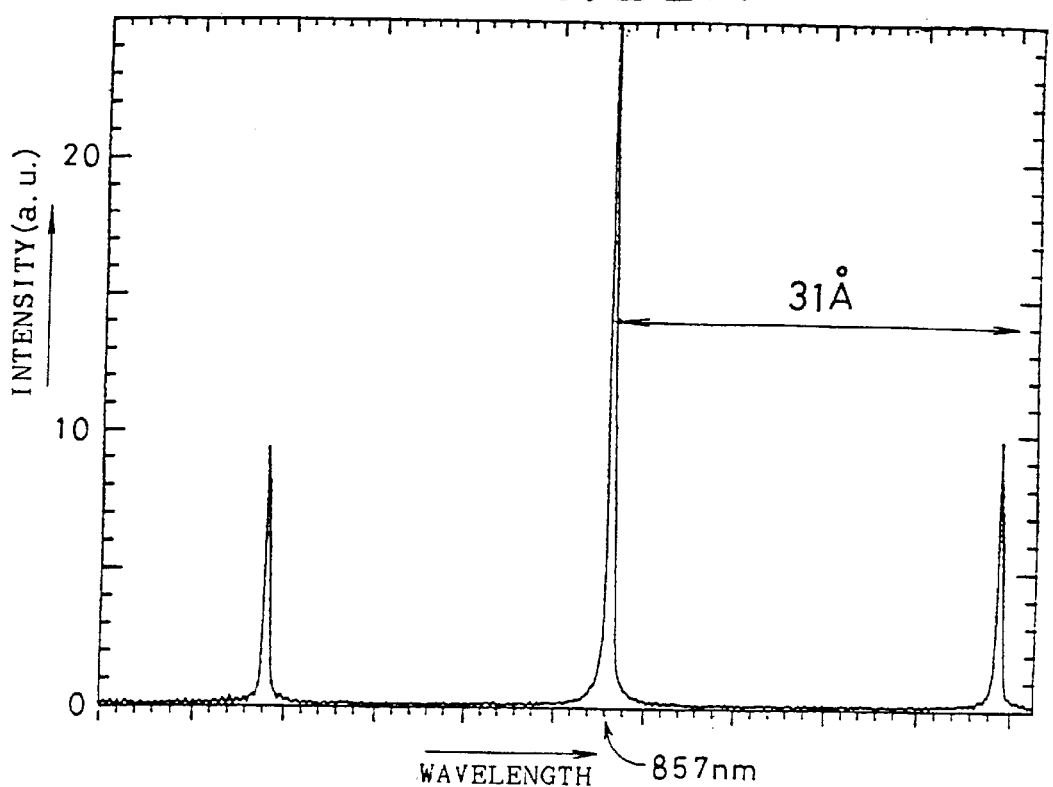
FIGS. 22A and 22B are graphs showing oscillation spectrum of semiconductor laser.
Figure 22B:
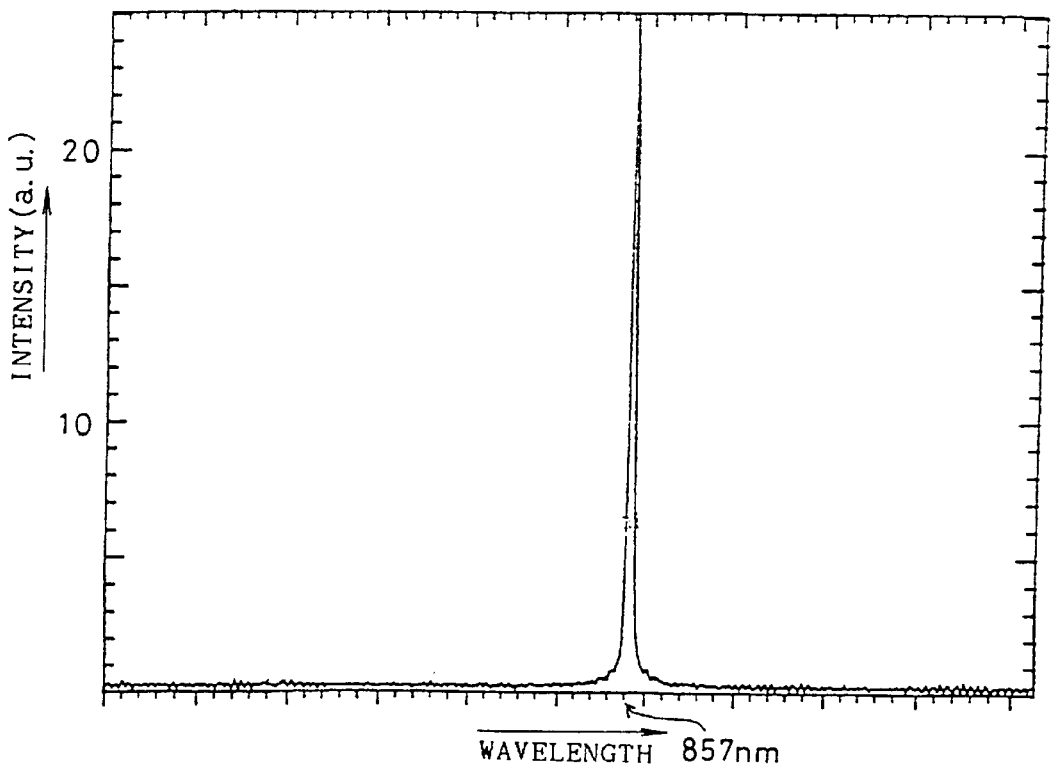

However, in the case where optical feedback is conducted by a birefringence filter, three oscillation spectra lines may occur when the output of the semiconductor laser exceeds 150 mW (FIG. 22A). For that reason, the thicknesses and number of birefringence plates were changed, namely three birefringence plates, whose thicknesses are 0.5 mm, 2.0 mm and 5 mm, respectively, were used and as a result single mode oscillation occurred even at 200 mW (FIG. 22B) and 1 mW output was stably obtained with high reproducibility.

Figure 23A:
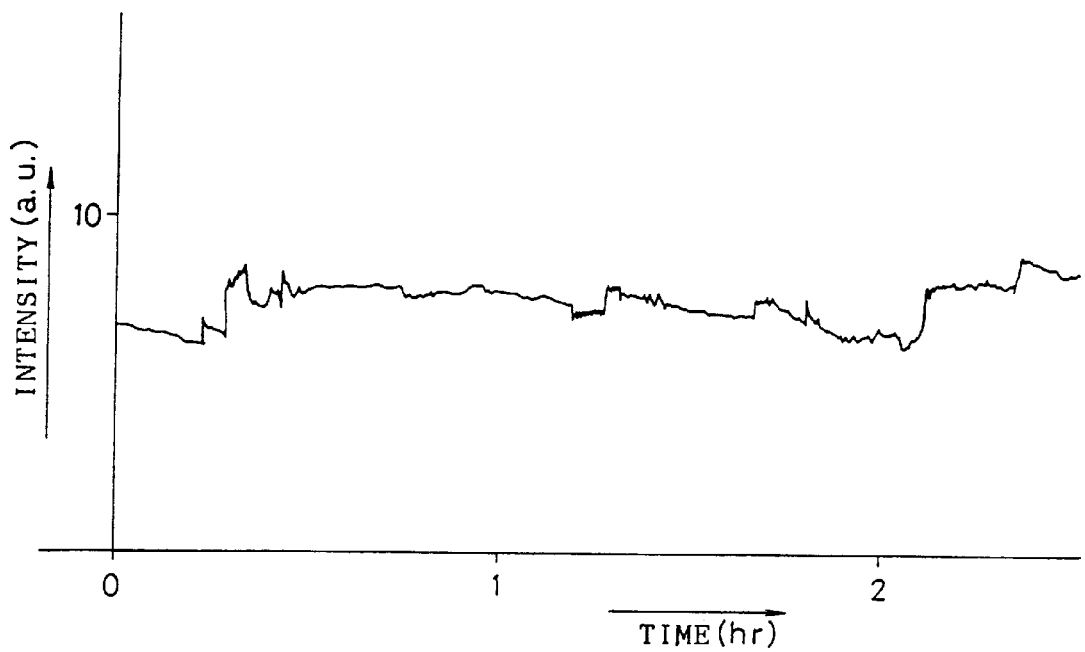
FIGS. 23A and 23B are graphs showing SHG output characteristics.
Figure 23B:
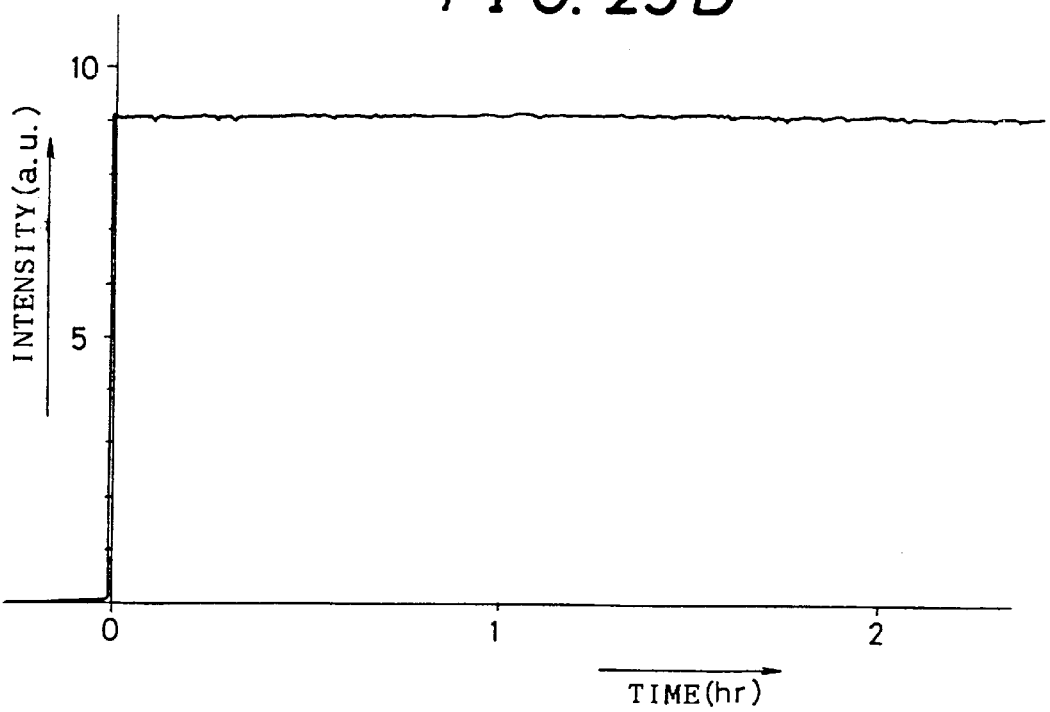

FIGS. 23B and 23A show SHG output characteristics in the case where output stabilization was conducted and in the case where output stabilization was not conducted. As seen from FIG. 23A, the SHG output remarkably changes every time jumping of the oscillation wavelength of the semiconductor laser occurs due to room temperature changes etc. On the other hand, as seen from FIG. 23B in the case where wavelength stabilization was conducted in relation to birefringence filters, therefore the output power changes were restrained to 2% or less over two hours or more, from which it is found that the measure is very effective for wavelength stabilization.

(Embodiment 9)

Figure 24:
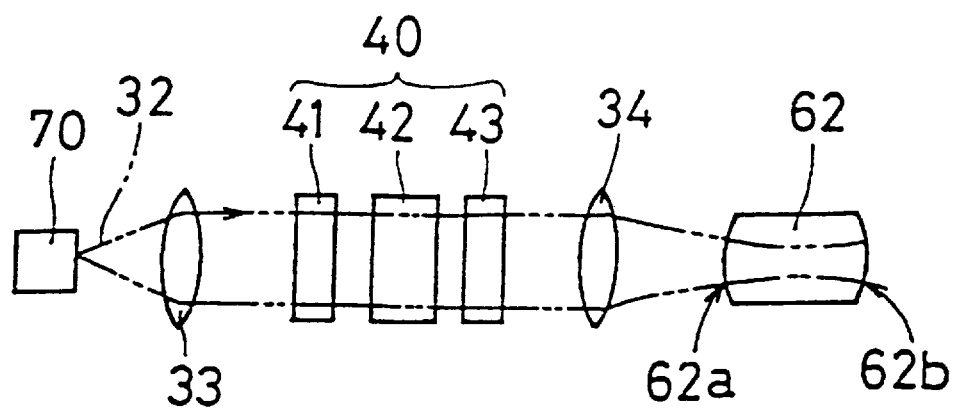
FIG. 24 is a structural diagram showing a ninth embodiment of the invention.
Figure 25:
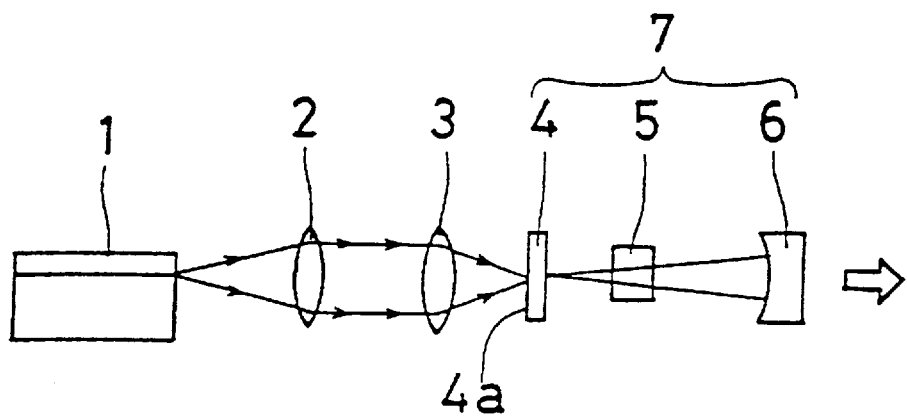
FIG. 25 is a schematic structural diagram showing a conventional short wavelength light source of internal resonator type.
Figure 26:
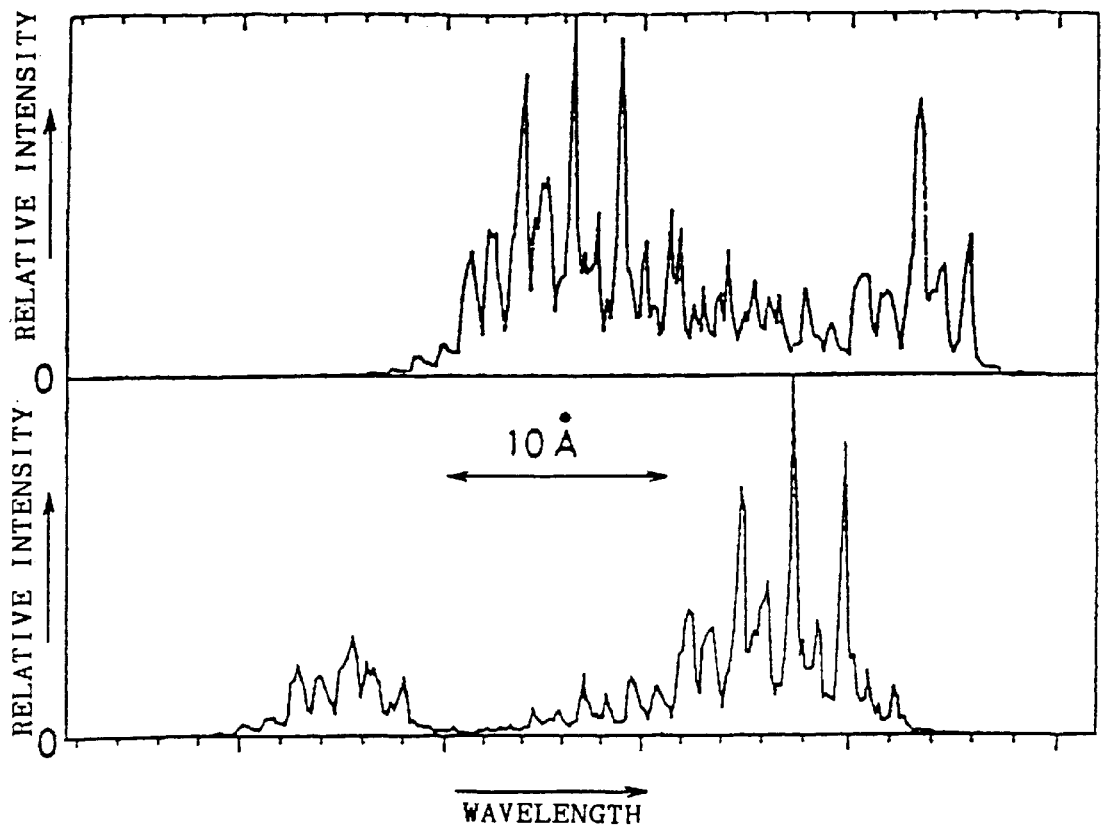
FIG. 26 is graphs showing spectrum changes by slightly deviating the distance from the semiconductor laser until the return light generation position, showing before deviation in the upper graph, and after deviation in the lower graph.
Figure 27:
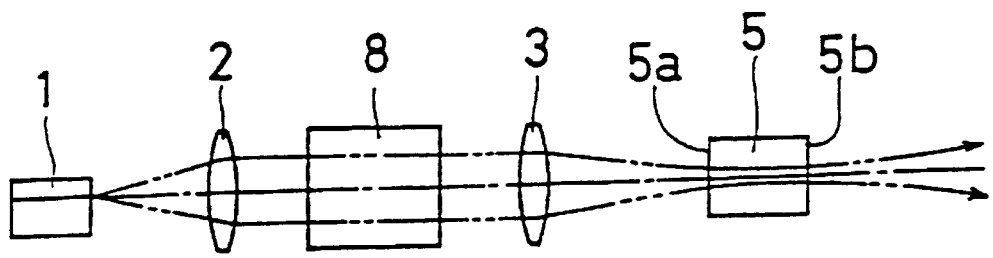
FIG. 27 is a schematic structural diagram showing still another example of a conventional short wavelength light source.
Figure 28A:
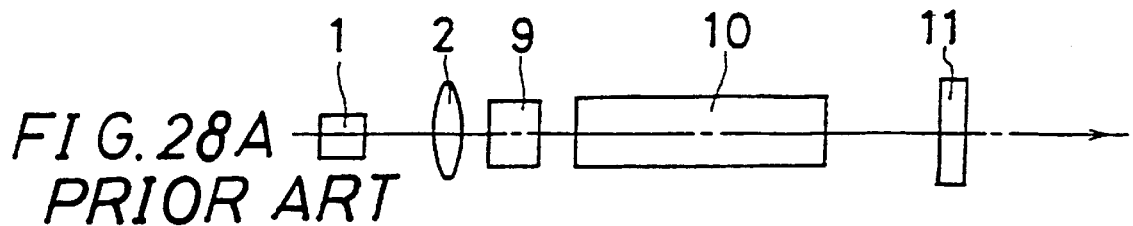
FIGS. 28A is a schematic structural diagram showing an example of wavelength variable light source using a semiconductor laser of external resonator type.
Figure 28B:
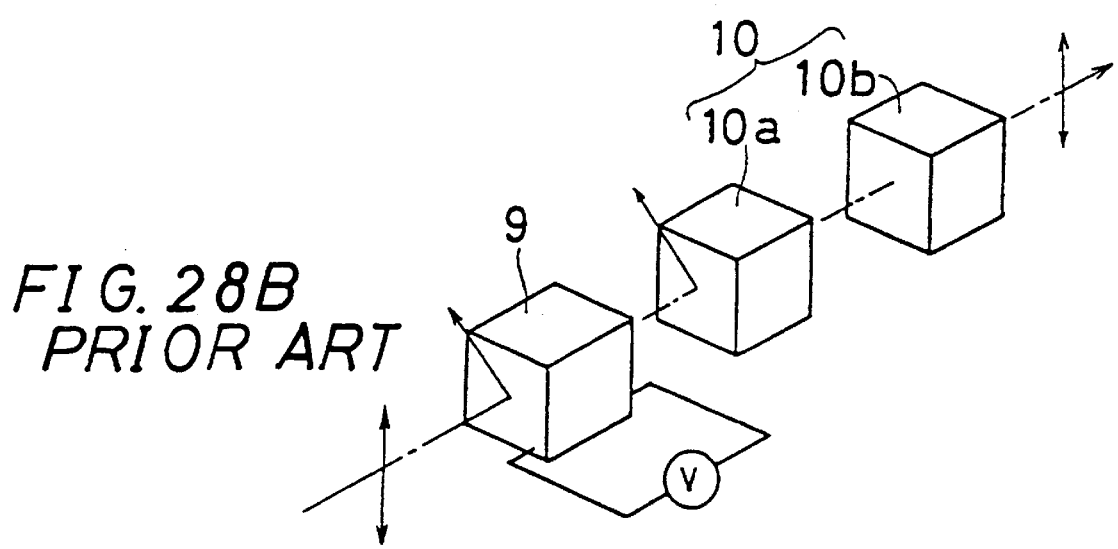
FIG. 28B is a partial perspective view thereof.

FIG. 24 is a structural diagram showing a ninth embodiment of the invention. This short wavelength light source is similar to seventh embodiment and intended to heighten the output by reflecting the fundamental wave light from the single mode semiconductor laser to the nonlinear optical crystal back and forth, and superposing the emitted short wavelength light. The end faces 62a, 62b of the nonlinear optical crystal 62 are spherically processed to be monolithic, and instead of emitting to the semiconductor laser 70 side as the exit direction, by folding back the second harmonic wave light forward, the second harmonic wave is emitted forward.

Using KNbO$_3$ crystal of a-axis cut with 10 mm crystal length as a nonlinear optical crystal 62, a spherical surface with radius of curvature of r=15 mm is formed by spherical processing on both end faces. The end face 62a on the incident side has an optical coating so as to have a reflectivity of 99.9% at 430 nm wavelength, and a transmissivity of 95% at 860 nm wavelength. At the end face 62b on the exit side, an optical coating is applied so as to have a reflectivity of 99.9% at 860 nm wavelength, and a transmissivity of 95% at 430 nm wavelength.

The principle of operation is described below. The fundamental wave light 32 emitted from the single mode semiconductor laser 70 is formed into a parallel beam by a collimating lens 33, and passes through the birefringence filter 40, and enters the nonlinear optical crystal 62 through a condenser lens 34, thereby generating a second harmonic wave directed rightwards. The fundamental wave light 32 reflected by the end face 62b of the nonlinear optical crystal 62 on the exit side passes again through the nonlinear optical crystal 62, and generates a second harmonic wave leftwards. The leftward fundamental wave 32 passes through the birefringence filter 40 again, and only a specific wavelength is optically fed back to the semiconductor laser 70. As a result, the semiconductor laser 70 can oscillate stably at a specific wavelength.

At this time, the second harmonic wave is emitted to the right and left directions of the nonlinear optical crystal 62, and the second harmonic wave generated leftwards is reflected by the end face 62a of the nonlinear optical crystal 62 on the incident side, and superposed the second harmonic wave emitted rightwards, and the output of four times in power is emitted rightwards from the end face 62b on the exit side.

Using a single mode diode (SDL-5430-C supplied by SDL) with 860 nm wavelength and 200 mw output as the semiconductor laser 70, 2 mm and 5 mm thick non-doped $YVO_4$ plates as the birefringence plates 41, 43, and a $KNbO_3$ crystal of a-axis cut with 10 mm crystal length as a nonlinear optical crystal 62, a 430 nm wavelength blue light with 1 mW output at 200 mW input could be stably obtained.

(Embodiment 10)

Figure 29:
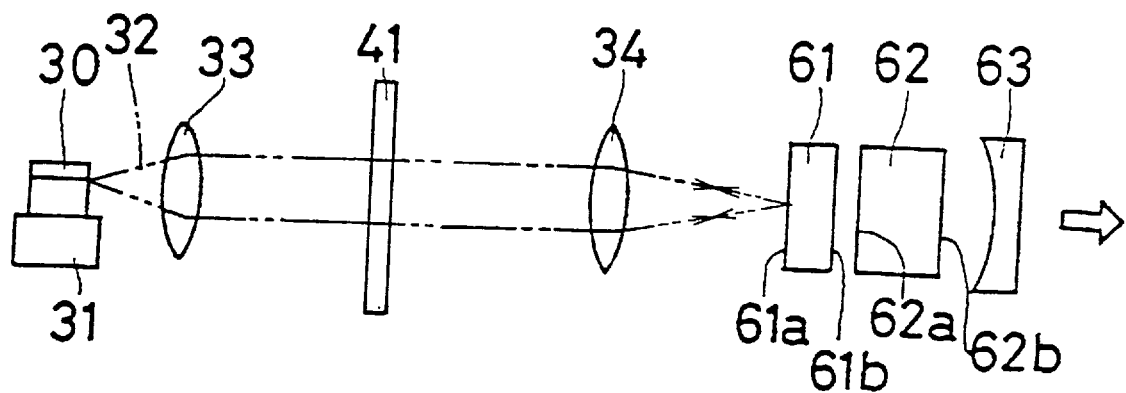
FIG. 29 is a structural diagram showing a tenth embodiment of the invention.

A tenth embodiment of the invention is shown in FIG. 29. The short wavelength light source, which is a simplification of the first embodiment, comprises a semiconductor laser for excitation and a solid state laser of an internal resonator type including a laser medium and SHG crystal. Duplicate explanations are omitted. The embodiment is an example indicating that a birefringence element and a polarizer as a component may be omitted in the case where a laser diode (LD) of such a type that a quantum well is formed in active layer is used as a semiconductor laser for exciting a solid state laser. Since there is little gain of polarization component (TM mode) in the direction vertical to the active layer in the quantum well semiconductor laser, oscillation at TM mode does not occur and therefore such a LD is equivalent to one having a polarizer of the TM mode direction on the output surface. Accordingly, even if no polarizer is provided, it is sufficient to use only one birefringence plate as a birefringence element. This embodiment is an example of using only a 0.25 mm thick non-doped $YVO_4$ as a birefringence element 41.

The operation principle is described below. Pumping light 32 radiated from the semiconductor laser 30 passes through the birefringence element 41 and oscillates the YAG crystal 61. The pumping light partially reflects on the end face 61a of the YAG crystal, passes again through the birefringence element 41, and returns to the semiconductor laser 30. The semiconductor laser 30 is considered as a LD having a polarizer and strong feedback to only a predetermined wavelength can be applied (wavelength filtering). Accordingly it is possible to oscillate the semiconductor laser 30 at only a predetermined wavelength, thereby realizing reduction in parts count and size as well as output stabilization.

(Embodiment 11)

Figure 30:
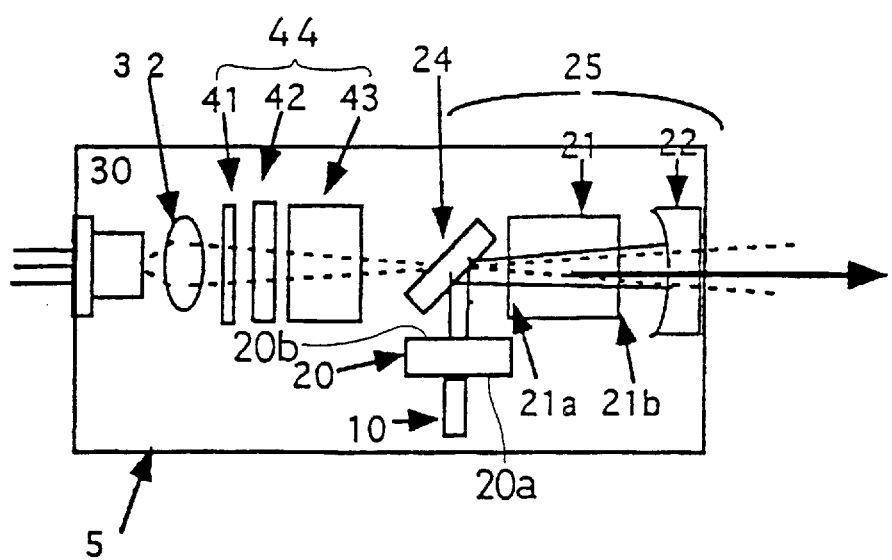
FIG. 30 is a structural diagram showing an eleventh embodiment of the invention.

FIG. 30 shows an example of generating 418 nm blue light by mixing light of 1064 nm light and 690 nm light by a LD excitation sum-frequency generating laser of the invention.

This is an example of a light source of the invention wherein size reduction of element and improvement of stabilization are realized by butt-coupling the solid state laser medium 20 and the LD 10 for excitation, while wavelength stabilization of the single mode LD for mixing is realized by a birefringence filter.

The LD excitation sum frequency laser comprises the semiconductor laser 10 for excitation which pumps the laser activating medium 20 and the optical resonator 25 including the laser medium 20 formed of $Nd:YVO_4$, wherein Nd is 1% doped as a solid state laser medium, the 90 degrees reflection mirror 24 the nonlinear optical element 21 formed of a-axis $KnbO_3$ and the output mirror 22.

The semiconductor laser 10 for excitation is butt-coupled with the solid state laser medium 20. The LD for excitation having a 50 μm stripe width with 500 mW output was used.

The surface 20a of the laser medium 20 is coated so that the reflectivity at 1064 nm oscillation wavelength of the laser medium 20 may be 99.9% and that the transmissivity at 809 nm wavelength of the pumping light may be 95% or more.

The surface of the 90 degrees reflection mirror 24 is, coated so that the reflectivity at 1064 wavelength may be 99.9% at 45 degrees incidence and the transmissivity at 690 nm wavelength may be 95%. The surface 20b of the laser medium 20 on the nonlinear optical element side is coated so that the transmissivity at 1064 nm oscillation wavelength may be 99.9% or more. The surface of the output mirror. 22 is coated so that the reflectivities at 1064 wavelength and 690 nm wavelength may be 99.9% and 70%, respectively, and that the transmissivity at 418 nm wavelength may be 95%.

Inverse population of is formed in the laser medium 20 by pumping light radiated from the semiconductor laser 10, and 1064 nm wavelength laser oscillation occurs in the case of $Nd:YVO_4$. The oscillation light resonates in the resonator 25 composed of the face 20a and the output mirror 22.

On the other hand, a 690 nm wavelength semiconductor laser light 30 with 30 mw output (TOLD-9150 supplied by Toshiba) was used as a light source for mixing. The laser light passes through the condensing lens 32 and a wavelength selecting element 44 composed of the birefringence plates 41, 43 and the polarizer 42, is condensed so as to form a beam waist on the face 21a, and enters the nonlinear optical element 21. As the birefringence plates 41, 43 are used 0.5 mm and 4 mm thick plates made of non-doped $YVO_4$.

The mixing light having passed through the nonlinear crystal 21 is partially reflected by the output mirror 22, passes again through the same path, passes again through the wavelength selecting element 44, and is fed back to the semiconductor laser 30. Wavelength stabilization of the mixing LD is conducted by the wavelength selecting element 44.

The embodiment is arranged so that both the polarization directions of 1064 nm wavelength laser light and a 690 nm wavelength fundamental wave externally introduced into the resonator are along the b-axis direction of the $KNbO_3$, and the output light which is mixing and sum frequency light and whose wavelength is converted to 418 nm is obtained in the polarization direction of c-axis.

The temperature of each optical element is controlled by Peltier element 5. The 418 nm wavelength sum frequency light 50 generated outgoes from the output mirror 22.

The oscillation wavelength of the LD for excitation was stabilized by butt-coupling the solid state laser medium with the LD 10 for excitation with the result that the fundamental wave intensity in the resonator was stabilized. Further each element could be reduced in size to be arranged on the same Peltier element 5 and as a result the temperature of each element could be controlled to be constant. Consequently it was possible to obtain 10 mW sum frequency outputs stably.

In the foregoing embodiments, as the semiconductor laser 30 for excitation of a solid state laser, examples are shown by fixing at 809 nm central wavelength of the absorption spectrum of Nd:YAG or Nd:YVO$_4$, but the tuning wavelength may be set freely by turning with angle, temperature or electric field of the two birefringent elements which are wavelength selecting elements. Therefore, as other laser media, for example, LiSrF, LiCaF, YLF (LiYF$_4$), NAB (NdAl$_3$(BO$_3$)$_4$), KNP, NYAB (Nd$_x$Y$_{1-x}$Al$_3$(BO$_3$)$_4$), NPP (NdP$_5$O$_{14}$), and GGG (Gd$_3$Ga$_5$O$_{12}$) may be also used.

Relating to the single mode semiconductor laser in the fourth embodiment, an example of using wavelength 860 nm capable of converting the wavelength with a-axis KNbO$_3$ of nonlinear optical crystal is explained, but it is also possible to use at a wavelength capable of converting wavelength by other inorganic nonlinear optical crystal material, such as KAP (KAsPO$_4$), BBO (β-BaB$_2$O$_4$), LBO (LiB$_3$O$_5$), LiNbO$_3$, and LiTaO$_3$. Or, as the wavelength converting element for single mode semiconductor laser, an example of entering the nonlinear optical crystal by one path is shown, but it is also applicable to a method of converting to a short wavelength by leading into a wavelength converting waveguide such as polarization inverting waveguide.

In the foregoing embodiments, it is also applicable to stabilization of fundamental wave laser not containing nonlinear optical material in the optical resonator.

The semiconductor laser used in the embodiments is an ordinary Fabry-Perot structure semiconductor laser with 95% rear reflectivity and about 4% front reflectivity, but for controlling the wavelength securely with a smaller quantity of return light, it is preferred to use an AR coated semiconductor laser with the front reflectivity lowered to about 0.1%.

In the foregoing embodiments, the invention may be also applied to the semiconductor laser for excitation light source of fiber type laser by up-conversion, using a fluoride fiber doped with rare earth elements such as Ho, Er, Tm, Sm and Nd.

A reflection coating as reflection means may be applied to a face of the element or a reflection mirror may be provided separately.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the, meaning and the range of equivalency of the claims are therefore intended to be embraced therein.

What is claimed is:

1. A wavelength stabilized light source comprising:
a semiconductor laser for oscillating laser light;
a wavelength selecting element having a band pass characteristic that the transmissivity of specified wavelength light is increased;
reflection means for applying optical feedback to the semiconductor laser through the wavelength selecting element; and
a wavelength converting element for converting the wavelength of the laser light sequentially passing through the wavelength selecting element and the reflection means from the semiconductor laser;
wherein the oscillation wavelength of the semiconductor laser is stabilized within a wavelength allowance of the wavelength converting element.

2. A wavelength stabilized light source comprising:
a semiconductor laser for oscillating excitation light;
a wavelength selecting element having a band pass characteristic that the transmissivity of specified wavelength light is increased;
reflection means for applying optical feedback to the semiconductor laser through the wavelength selecting element; and
an optical resonator containing a laser medium to be excited by excitation light and a nonlinear optical element for wavelength conversion,
wherein the oscillation wavelength of the semiconductor laser is stabilized within the absorption spectrum of the laser medium.

3. A wavelength stabilized light source comprising:
a first semiconductor laser for oscillating excitation light;
a second semiconductor laser for oscillating mixing light;
a wavelength selecting element having a band pass characteristic that the transmissivity of specified wavelength light is increased;
an optical resonator containing a laser medium to be excited by excitation light and a nonlinear optical element for wavelength conversion; and
reflection means for applying optical feedback to the first and second semiconductor lasers through the wavelength selecting element.

4. A wavelength stabilized light source comprising:
a semiconductor laser for oscillating excitation light;
a laser medium for emitting fundamental wave laser light by being excited by light of a predetermined wavelength within the range of wavelength of the excitation light;
an optical resonator including the laser medium;
a wavelength selecting element composed of polarization means and a birefringence element, the wavelength selecting element giving priority of transmission to the light of the predetermined wavelength of the excitation light; and
reflection means for applying optical feedback to the semiconductor laser through the wavelength selecting element.

5. A wavelength stabilized light source comprising:
a semiconductor laser for oscillating laser light;
a nonlinear optical element for wavelength conversion of a laser light of a predetermined wavelength within the wavelength range of the laser light and emitting short wavelength laser light;
a wavelength selecting element composed of polarization means and a birefringence element, the wavelength selecting element giving priority of transmission of the light of the predetermined wavelength of the laser light; and
reflection means for applying optical feedback to the semiconductor laser through the wavelength selecting element.

6. A wavelength stabilized light source comprising:
a semiconductor laser for oscillating excitation light;
a laser medium for emitting fundamental wave laser light by being excited by light of a predetermined wavelength within the range of wavelength of the excitation light;
a nonlinear optical element for converting the wavelength of the fundamental wave laser light and emitting short wavelength laser light;
an optical resonator including the laser medium and the nonlinear optical element;
a wavelength selecting element composed of polarization means and a birefringence element, the wavelength selecting element giving priority of transmission to the light of the predetermined wavelength of the excitation light; and reflection means for applying optical feedback to the semiconductor laser through the wavelength selecting element.

7. A wavelength stabilized light source comprising:

a first semiconductor laser for oscillating excitation light;

a second semiconductor laser for oscillating mixing light;

a laser medium for emitting fundamental wave laser light by being excited by light of a predetermined wavelength within the range of wavelength of the excitation light;

a nonlinear optical element for emitting laser light of a certain wavelength by mixing the fundamental wave laser light and the mixing light;

an optical resonator including the laser medium and the nonlinear optical element;

a wavelength selecting element composed of polarization means and a birefringence element, the wavelength selecting element giving priority of transmission to the light of the predetermined wavelength of the excitation light; and reflection means for applying optical feedback to the first semiconductor laser through the wavelength selecting element.

8. A wavelength stabilized light source comprising:

a first semiconductor laser for oscillating excitation light;

a second semiconductor laser for oscillating mixing light;

a laser medium for emitting fundamental wave laser light by being excited by light of a predetermined wavelength within the range of wavelength of the excitation light;

a nonlinear optical element for emitting laser light of a certain wavelength by mixing the fundamental wave laser light and the mixing light;

an optical resonator including the laser medium and the nonlinear optical element;

a wavelength selecting element composed of polarization means and a birefringence element, the wavelength selecting element giving priority of transmission to the light of the predetermined wavelength of the mixing light; and reflection means for applying optical feedback to the second semiconductor laser through the wavelength selecting element.

9. A wavelength stabilized light source comprising:

a first semiconductor laser for oscillating excitation light;

a second semiconductor laser for oscillating mixing light;

a laser medium for emitting fundamental wave laser light by being excited by light of a first predetermined wavelength within the range of wavelength of the excitation light;

a nonlinear optical element for emitting laser light of a certain wavelength by mixing light of a second predetermined wavelength within the range of wavelength of the mixing light and the fundamental wave laser light;

an optical resonator including the laser medium and the non-linear optical element;

a first wavelength selecting element composed of polarization means and a birefringence element, the first wavelength selecting element giving priority of transmission to the light of the first predetermined wavelength of the excitation light;

first reflection means for applying optical feedback to the first semiconductor laser through the first wavelength selecting element;

a second wavelength selecting element composed of polarization means and a birefringence element, the second wavelength selecting element giving priority of transmission to the light of the second predetermined wavelength of the excitation light; and second reflection means for applying optical feedback to the second semiconductor laser through the second wavelength selecting element.

10. The wavelength stabilized light source of any one of claims 1 to 9, wherein the wavelength selecting element is a birefringence filter of Lyot containing a birefringence element and a polarizer.

11. The wavelength stabilized light source of any one of claims 4 to 9, wherein the wavelength selecting element is a birefringence filter whose birefringence element is inclined to the optical axis by a Brewstar angle.

12. The wavelength stabilized light source of any one of claims 4 to 9, wherein the birefringence element used in the wavelength selecting element is a liquid crystal.

13. The wavelength stabilized light source of any one of claims 4 to 9, wherein the birefringence element used in the wavelength selecting element is a crystal composed of non-doped $YVO_4$ or $KNbO_3$.

14. The wavelength stabilized light source of any one of claims 4, 6, 7 or 9, wherein the laser medium has a birefringent property, and is used as birefringence element of the wavelength selecting element.

15. The wavelength stabilized light source of any one of claims 5 to 9, wherein the nonlinear optical element has a birefringent property and is used as a birefringence element of the wavelength selecting element.

16. The wavelength stabilized light source of any one claims 4 to 9, wherein the polarization means is included in the semiconductor laser to which the optical feedback is applied.

17. The wavelength stabilized light source of claim 16, wherein the semiconductor laser to which the optical feedback is applied has a quantum well structure.

18. The wavelength stabilized light source of claim 8, wherein an end face of the first semiconductor laser from which the excitation light outgoes is butt-coupled with an end face of laser medium into which the excitation light incidents.

19. A wavelength stabilized light source comprising:

a semiconductor laser for oscillating fundamental light;

a wavelength selecting element having a band pass characteristic that the transmissivity of specified wavelength light is increased;

a nonlinear optical element for generating harmonic waves by converting the wavelength of a fundamental wave having passed through the wavelength selecting element; and fundamental wave reflection means for reflecting the fundamental wave passed through the nonlinear optical element and applying optical feedback to the semiconductor laser through the wavelength selecting element; and harmonic wave reflection means for superposing the harmonic waves generated by the nonlinear optical element in one direction.

* * * * *